US011217643B2

(12) United States Patent
Xu et al.

(10) Patent No.: US 11,217,643 B2
(45) Date of Patent: Jan. 4, 2022

(54) DISPLAY SCREENS AND ELECTRONIC DEVICES HAVING ELECTROVARIABLE LIGHT TRANSMITTANCE MATERIAL

(71) Applicant: Yungu (Gu'an) Technology Co., Ltd., Langfang (CN)

(72) Inventors: Tong Xu, Langfang (CN); Qi Shan, Langfang (CN); Rubo Xing, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 115 days.

(21) Appl. No.: 16/679,257

(22) Filed: Nov. 10, 2019

(65) Prior Publication Data
US 2020/0075697 A1 Mar. 5, 2020

Related U.S. Application Data

(63) Continuation of application No. PCT/CN2018/089650, filed on Jun. 1, 2018.

(30) Foreign Application Priority Data

Sep. 30, 2017 (CN) .......................... 201710923353.2
Sep. 30, 2017 (CN) .......................... 201710923370.6
(Continued)

(51) Int. Cl.
*H01L 29/08* (2006.01)
*H01L 35/24* (2006.01)
(Continued)

(52) U.S. Cl.
CPC ....... *H01L 27/3246* (2013.01); *G09G 3/3233* (2013.01); *H01L 27/326* (2013.01);
(Continued)

(58) Field of Classification Search
CPC ............. H01L 27/3246; H01L 27/3232; H01L 27/326; H01L 51/5284; H01L 2227/323;
(Continued)

(56) References Cited

U.S. PATENT DOCUMENTS 10,177,204 B2   1/2019  Li et al.
10,228,602 B2   3/2019  Cao et al.
(Continued)

FOREIGN PATENT DOCUMENTS

CN   102751312 A   10/2012
CN   104965338 A   10/2015
(Continued)

OTHER PUBLICATIONS

International Search Report dated Aug. 31, 2018 in the corresponding international application (application No. PCT/CN2018/089650).
(Continued)

*Primary Examiner* — Ismail A Muse
(74) *Attorney, Agent, or Firm* — Kilpatrick Townsend & Stockton

(57) ABSTRACT

The present application relates to a display screen and an electronic device. The display screen comprises a first display area for arranging a front device, wherein the first display area is provided with a first type of light-emitting unit; the first type of light-emitting unit comprises a pixel area and an electrochromic light transmittance material disposed around the pixel area; the electrochromic light transmittance material exhibits a light absorption property when being energized; and the electrochromic light transmittance material exhibits a light transmission property when not being energized. In addition, the present application also relates to an electronic device comprising the above-mentioned display screen.

18 Claims, 31 Drawing Sheets

(30) Foreign Application Priority Data

| | | | |
|---|---|---|---|
| Sep. 30, 2017 | (CN) | ......................... | 201710939191.1 |
| Feb. 9, 2018 | (CN) | ......................... | 201810136238.5 |
| Feb. 9, 2018 | (CN) | ......................... | 201810136310.4 |
| Feb. 9, 2018 | (CN) | ......................... | 201810136339.2 |

(51) Int. Cl.
*H01L 51/00* (2006.01)
*H01L 27/32* (2006.01)
*G09G 3/3233* (2016.01)
*H01L 51/52* (2006.01)

(52) U.S. Cl.
CPC ...... *H01L 27/3232* (2013.01); *H01L 51/5284* (2013.01); *H01L 2227/323* (2013.01); *H01L 2251/303* (2013.01)

(58) Field of Classification Search
CPC .......... H01L 2251/303; H01L 27/3216; G09G 3/3233; G02F 1/157
See application file for complete search history.

(56) References Cited

U.S. PATENT DOCUMENTS

| | | | | |
|---|---|---|---|---|
| 2007/0217784 | A1* | 9/2007 | Kaneiwa | G03B 7/18 396/506 |
| 2011/0228376 | A1* | 9/2011 | Chung | G02F 1/15 359/273 |
| 2014/0320782 | A1* | 10/2014 | Uhm | G02F 1/1503 349/62 |
| 2016/0178812 | A1 | 6/2016 | Gao et al. | |
| 2016/0358988 | A1* | 12/2016 | Matsubara | H01L 29/78633 |
| 2017/0078543 | A1* | 3/2017 | Lee | H04N 5/2328 |
| 2017/0123454 | A1* | 5/2017 | Evans, V | G02F 1/1368 |
| 2017/0179205 | A1* | 6/2017 | Kim | H01L 51/5237 |
| 2017/0219900 | A1 | 8/2017 | Kim et al. | |
| 2017/0310956 | A1* | 10/2017 | Perdices-Gonzalez | ...................... H04N 13/366 |

FOREIGN PATENT DOCUMENTS

| | | |
|---|---|---|
| CN | 105448825 A | 3/2016 |
| CN | 105870153 A | 8/2016 |
| CN | 106199771 A | 12/2016 |
| CN | 106292017 A | 1/2017 |
| CN | 106384565 A | 2/2017 |
| CN | 107221548 A | 9/2017 |
| CN | 107644895 A | 1/2018 |
| JP | 2004341156 A | 12/2004 |
| KR | 20170089055 A | 8/2017 |
| TW | 201447454 A | 12/2014 |
| TW | 201643517 A | 12/2016 |
| WO | 2016192378 A1 | 12/2016 |

OTHER PUBLICATIONS

CN First Office Action with search report dated Mar. 22, 2019 in the corresponding CN application (application No. 201810136238.5).
CN First Office Action with search report dated Apr. 2, 2019 in the corresponding CN application (application No. 201810136310.4).
CN First Office Action with search report dated Mar. 22, 2019 in the corresponding CN application (application No. 201810136339.2).
CN Second Office Action with search report dated Jul. 10, 2019 in the corresponding CN application (application No. 201810136238.5).
TW Office Action with search report dated Mar. 27, 2019 in the corresponding TW application (application No. 107122512).
CN Second Office Action with search report dated Jul. 10, 2019 in the corresponding CN application (application No. 201810136310.4).
CN Second Office Action with search report dated Jul. 10, 2019 in the corresponding CN application (application No. 201810136339.2).
CN Third Office Action dated Sep. 25, 2019 in the corresponding CN application (application No. 201810136238.5).
CN Third Office Action dated Sep. 25, 2019 in the corresponding CN application (application No. 201810136310.4).
CN Third Office Action with search report dated Sep. 25, 2019 in the corresponding CN application Kapplication No. 201810136339.2).
Electrochromic Materials for New Materials Research Topics: Large Space, High Barrier, Industrial Layout Right Now (English Summary), 25 pages.

* cited by examiner

DISPLAY SCREENS AND ELECTRONIC DEVICES HAVING ELECTROVARIABLE LIGHT TRANSMITTANCE MATERIAL

CROSS-REFERENCES TO RELATED APPLICATIONS

This application is a continuation application for International Application PCT/CN2018/089650, filed on Jun. 1, 2018, which claims priority to the following Chinese Patent Applications:

Chinese Patent Application No. 201810136238.5, entitled "DISPLAY SCREENS AND ELECTRONIC DEVICES", filed on Feb. 9, 2018;

Chinese Patent Application No. 201710923370.6, entitled "DISPLAY SCREENS AND ELECTRONIC DEVICES", filed on Sep. 30, 2017;

Chinese Patent Application No. 201810136339.2, entitled "DISPLAY SCREENS AND ELECTRONIC DEVICES", filed on Feb. 9, 2018;

Chinese Patent Application No. 201710923353.2, entitled "DISPLAY SCREENS AND ELECTRONIC DEVICES", filed on Sep. 30, 2017;

Chinese Patent Application No. 201810136310.4, entitled "DISPLAY SCREENS AND ELECTRONIC DEVICES", filed on Feb. 9, 2018; and Chinese Patent Application No. 201710939191.1, entitled "DISPLAY SCREENS AND ELECTRONIC DEVICES", filed on Sep. 30, 2017.

The contents of above applications are incorporated by reference herein for all purposes.

TECHNICAL FIELD

The present disclosure relates to the technical field of display.

BACKGROUND

In the prior art, a display screen generally includes an array substrate, a light-emitting layer formed on the array substrate, and a module structure over the light-emitting layer. The module structure may generally include a touch layer, a polarizer, and a cover plate.

SUMMARY

Accordingly, in view of the technical problem of how to improve the display screen, it is necessary to provide an improved display screen and an electronic devices.

According to a first aspect of the present disclosure, a display screen is provided, the display screen includes a first display region for arranging a front device; a first-type light-emitting unit provided in the first display region. The first-type light-emitting unit includes a pixel region and an electro-variable light transmittance material located on a periphery of the pixel region, the electro-variable light transmittance material is light absorbable during a power on process, and the electro-variable light transmittance material is light transmissive during a power off process.

Since the first-type light-emitting unit of the present disclosure has the electro-variable light transmittance material, when the conductive layer is powered on, the pixel region of the first-type light-emitting unit emits light, the electro-variable light transmittance material is light absorbable and then reduces the influence of the ambient light, so that the display is normal. Thus, no polarizer is required for the first display region of the display screen, thereby achieving an improvement of the display screen.

According to a second aspect of the present disclosure, an electronic device is provided, the electronic device includes the above display screen and an under-screen photosensitive module capable of sensing light incident through the display screen; the display screen includes: a first display region for arranging a front device; a first-type light-emitting unit being provided in the first display region, the first-type light-emitting unit comprising a pixel region and an electro-variable light transmittance material located on a periphery of the pixel region, and the electro-variable light transmittance material being light absorbable during a power on process, and is light transmissive during a power off process.

In the electronic device of the present disclosure, since the first-type light-emitting unit of the above display screen has the electro-variable light transmittance material, when the conductive layer is powered on, the pixel region of the first-type light-emitting unit emits light, the electro-variable light transmittance material is light absorbable and then reduces the influence of the ambient light, so that the display is normal. Thus, no polarizer is required for the first display region of the display screen, thereby achieving an improvement of the display screen.

In the electronic device of the present disclosure, since the first display region of the above display screen contains the electro-variable light transmittance material, the first display region can normally display when the conductive layer is powered on; and when the conductive layer is powered off, the pixel region of the first-type light-emitting unit does not emit light, and the electro-variable light transmittance material shows light transmittance, whereby the first display region becomes nearly transparent, thereby allowing ambient light to smoothly irradiate through the first display region of the display screen. In this way, a under-screen photosensitive module of at least one of a photoelectric sensor and a camera can be positioned under the display screen and aligned with the first display region. Accordingly, the display screen according to the embodiment does not have to reserve a position for the front camera, and can even omit the non-display region of the display screen, thereby increasing the screen-to-body ratio, and optimizing the user experience.

DETAILED DESCRIPTION OF THE INVENTION

For display devices, a polarizer can greatly reduce the incident of ambient light into the display screen, thereby greatly improving the display effect of the display screen, but it may also make it difficult to improve the display screen.

The present disclosure is described in details in combination with the accompanying drawings and embodiments such that the purpose, technical solution and advantages of the present disclosure are more apparent. It should be understood that the particular embodiments are described for the purpose of comprehending the present disclosure more fully and completely.

Figure 1:
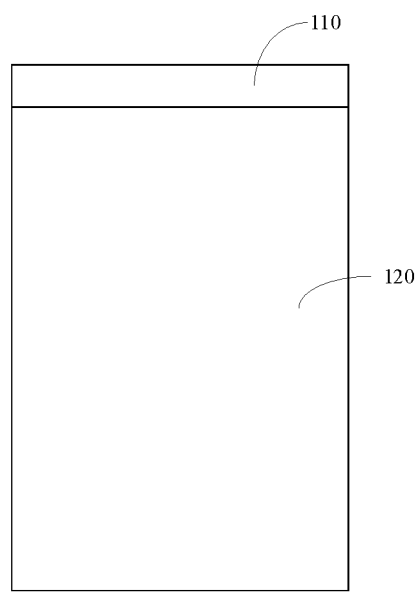
FIG. 1 is a schematic view of a structure of a display screen according to one embodiment.

In one embodiment, FIG. 1 is a schematic view of a structure of a display screen according to an embodiment. The display screen may be adapted to various terminals to satisfy a user's demand for a full screen display of the terminals. The terminals may be a mobile phone, a tablet computer, a handheld computer, a computer, and other devices.

Figure 2:
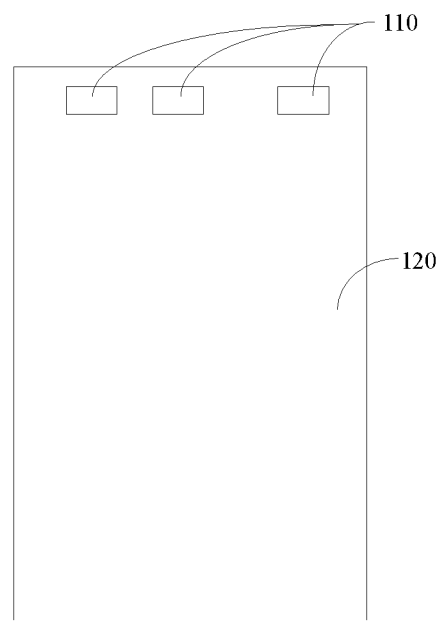
FIG. 2 is a schematic view of a structure of a display screen according to the embodiment.

In the embodiment, the display screen includes a display area. The display area includes two display regions. The two display regions are a first display region 110 and a second display region 120, respectively. The first display region 110 and the second display region 120 together form the entire display area of the display screen. Specifically, the entire display area formed by the first display region 110 and the second display region 120 is a screen area of the display screen, thereby enabling the display screen to truly realize a full-screen display. In the embodiment, the first display region 110 and the second display region 120 are located at opposite ends of the display screen. That is, the display screen includes a first end and a second end that are oppositely located, the first display region 110 is located at the first end of the display screen, the second display region 120 is located at the second end of the display screen, the second end is a portion of the display screen other than the first end. The first display region 110 and the second display region 120 are sequentially located along the length direction of the terminal. In other embodiments, the first display region 110 and the second display region 120 may be sequentially located along the width direction of the terminal. In an embodiment, the first display region 110 may also be surrounded by the second display region 120. The position of the first display region 110 on the display screen may be determined according to the position of the front device in the terminal. In the present disclosure, the front device refers to a device that needs to be installed on one side of the terminal on which the display screen located, that is, a device and the display screen are on the same side of a conventional terminal. The front device may be a front camera, a photosensitive device (or a light-sensing device) or a product LOGO displayed on demand, etc. When a plurality of front devices are collectively located in one area, the first display region 110 may be one. When a plurality of front devices are dispersedly located in a plurality of regions, as shown in FIG. 2, a plurality of first display regions 110 may be provided so that each of the first display regions 110 corresponds to one or more front devices. A total thickness of the metal layer in the first display region 110 is less than a total thickness of the metal layer of the second display region 120. Specifically, the thickness of the first display region 110 is less than or equal to a thickness corresponding to when the second display region 120 assumes transparence in the unlit state.

The display screen includes at least the first display region 110 and the second display region 120, the total thickness of the metal layer of the first display region 110 is less than the total thickness of the metal layer of the second display region 120, the thickness of the first display region 110 is less than or equal to a thickness corresponding to when the second display region 120 assumes transparence in the unlit state. Therefore, when the terminal uses the display screen as described above, a front device such as a front camera or the like may be located below the first display region 110. When the front camera is to be used, it is only necessary to control the first display region 110 not to be lit, and when the front camera is not in working, each display region in the display screen can display normally, thereby truly realizing a full screen display.

In the embodiment, the total thickness of the metal layers in the first display region 110 is less than or equal to 10% to 80% of the total thickness of the metal layers of the second display region 120, thereby ensuring that the first display region 110 is transparent when the first display region 110 is unlit after the metal layer is thinned. In the embodiment, the first display region 110 is located at the end edge position of the display screen, so that the display effect of the first display region 110 is not affected even if the trace impedance increases due to the thinning of the metal layer of the display region.

In the embodiment, in the process of thinning the metal layer in the first display region 110, a corresponding thinning process is performed on each metal layer in the display region, thereby ensuring that each metal layer can work properly. That is, the thickness of each metal layer in the first display region 110 is 10% to 80% of the thickness of the same metal layer in the second display region 120. Optionally, the thickness of each metal layer in the first display region 110 is reduced by the same ratio with respect to the thickness of the corresponding metal layer in the second display region 120.

In the embodiment, a transparent flat layer is formed on each metal layer in the display screen. The flat layer may be filled with a transparent insulating material. Therefore, the sum of the thickness of each of the metal layers and the thickness of the connecting flat layer in the first display region 110 is equal to the sum of the thickness of each of the metal layers and the connecting flat layer in the second display region 120, so that the entire display screen has better flatness. That is, the metal layer of the first display region 110 has a thickness thinner than that of the corresponding metal layer of the second display region 120, and the flat layer of the first display region 110 in contact with the thinned metal layer is thicker than the flat layer of the second display region 120 in contact with the corresponding metal layer, so that the total thickness of the first display region 110 and the total thickness of the second display region 120 are the same.

In the embodiment, the display screen further includes a flash-black circuit. The flash-black circuit is connected to the pixel circuit of the first display region 110. The flash-black circuit is configured to receive a control signal and control each pixel of the first display region 110 to be in a non-display state when the control signal is received. The control signal may be sent from a device such as a controller on the terminal where the display screen is located. For example, when the controller in the terminal detects the working of the front device (such as the front camera and the photosensitive device) under the first display region 110, the control signal is generated and outputted to the flash-black circuit. After receiving the control signal, the flash-black circuit controls each pixel of the first display region 110 on the display screen to be in a non-display state. Specifically, if the first display region 110 on the display screen is in the display state, the flash-black circuit controls the pixels on the first display region 110 to be turned off, that is, the flash-blacking, so that the first display region 110 is in the non-display state. Since the first display region 110 is transparent when the first display region 110 is in the non-display state (i.e., the unlit state), light can incident through the first display region and enter the corresponding front device normally, thereby ensuring that the front device can work normally. If the first display region 110 on the display screen is in the non-display state, that is, the unlit state, the flash-black circuit controls the first display region 110 to remain in the non-display state. In this embodiment, the flash-black circuit is in a standby state and does not work when no control signal is received, so that the normal display of each display region on the display screen is not affected. The flash-black circuit enters the working state only when receiving the control signal, thereby realizing the display control of the first display region 110 without affecting the normal display of the other display regions.

Figure 3:
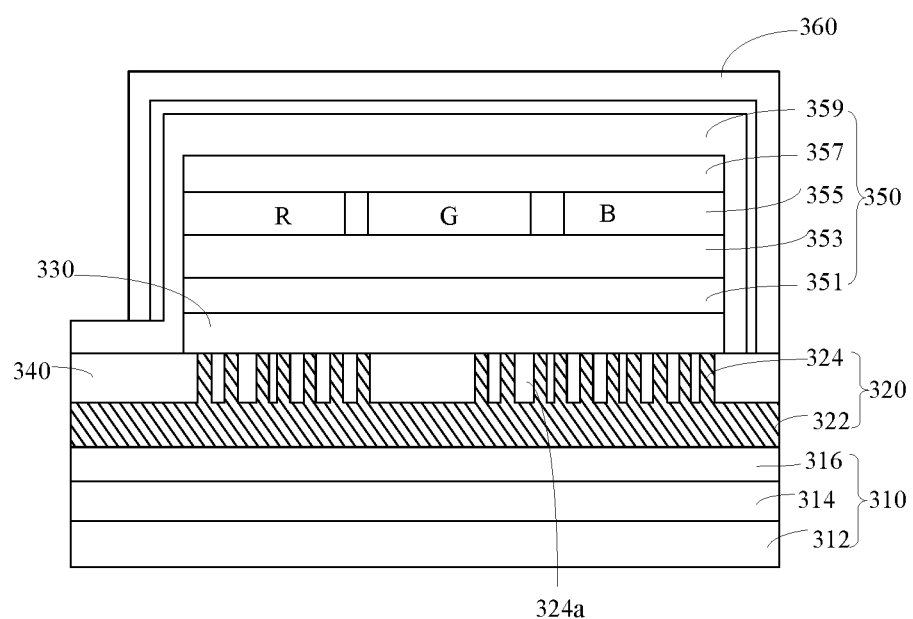
FIG. 3 is a cross-sectional view of a display screen according to the embodiment.

FIG. 3 is a cross-sectional view of a display screen according to the embodiment. Referring to FIG. 3, the display screen includes a substrate 310, a screen circuit layer 320, a power transistor layer 330, an insulating layer 340, and a light-emitting module 350.

The substrate 310 includes a substrate 312, an adhesive layer 314 located on the substrate 312, and a buffer layer (BL) 316 located on the adhesive layer 314. The substrate 312 may be a glass substrate, a plastic substrate, or a stainless steel substrate.

The screen circuit layer 320 is located on the buffer layer 316 of the substrate 310. The screen circuit layer 320 includes a first portion 322 and a second portion 324 formed on the first portion 322. The power transistor layer 330 is located above the screen circuit layer 320 and is connected to the second portion 324 of the screen circuit layer 320. In the embodiment, the power transistor layer 330 is a thin film transistor (TFT) layer. The insulating layer 340 fills areas where the screen circuit layer 320 is not connected to the power transistor layer 330. The light-emitting module 350 is located on the power transistor layer 330.

In the embodiment, by disposing the screen circuit layer 320 and the power transistor layer 330 between the light-emitting module 350 and the substrate 310, i.e., by designed as an upper and lower three-dimensional structure, instead of adopting a conventional tiled structure arranged located on a periphery of the light-emitting module, the frame can be avoided, and the display screen without a frame can be realized, thereby ensuring that the display screen can realize a full screen display. In this embodiment, a plurality of grooves 324a are formed on the second portion 324 of the screen circuit layer 320. The plurality of grooves 324a are uniformly distributed such that the widths of the second portions 324 among the grooves 324a are uniform and small, thereby facilitating connection of various circuits in the screen circuit layer 320 to the power transistor layer 320. In addition, by providing a plurality of grooves 324a on the second portion 324, it is advantageous to improve the transparency of the entire display screen.

The light-emitting module 350 includes an anode 351, a hole layer 353 located on the anode 351, a light-emitting layer 355 located on the hole layer 353, an electron layer 357 provided on the light-emitting layer 355 and a cathode layer 359 provided on the electron layer 357. The cathode layer 359 extends from both ends thereof downward (toward the substrate 312) to the insulating layer 340 and along the insulating layer 340 to one end of the insulating layer 341, respectively, so as to be connected to an external circuit. That is, in the embodiment, the metal layer in the display screen includes a layered structure including the screen circuit layer 320, the anode 351, and the cathode 359 having a metal circuit. The light-emitting layer 355 includes three light-emitting units of a red (R) light-emitting unit, a green (G) light-emitting unit, and a blue (B) light-emitting unit arranged uniformly. The light-emitting module 350 may be implemented in a conventional design.

In the embodiment, a encapsulation layer 360 covering the light-emitting module 350 is also formed above the light-emitting module 350. The encapsulation layer 360 forms a wrapping space with the insulating layer 340 and the cathode 359 to wrap the power transistor layer 330 and the light-emitting module 350.

Figure 4:
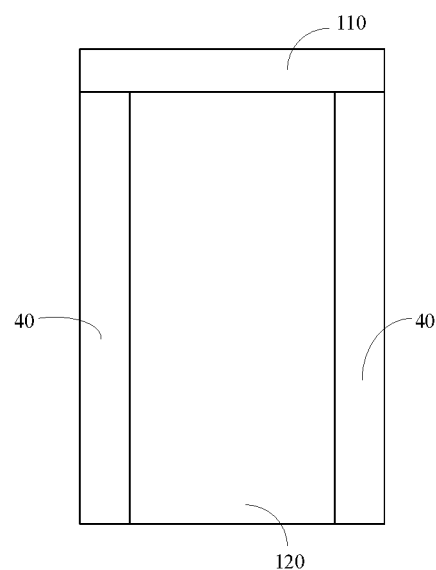
FIG. 4 is a schematic view of a position of a drive circuit in a display screen according to the embodiment.

In the embodiment, the screen circuit layer 320 is provided with pixel circuits and driving circuit. The pixel circuits are distributed over the entire display region of the display screen, and the driving circuit are located below the pixel circuits and located on both sides of the second display region 120. The position of driving circuit 40 located is shown in in FIG. 4. The size of the area where the driving circuit are located may be set as needed. By integrating the driving circuit 40 in the screen circuit layer 320 of the display screen, the frame can be avoided, thereby ensuring that the display screen can realize full-screen display.

The display screen is not limited to be used in a terminal with a front device, and may be used in other terminals without a front device, that is, the display screen may be applied to any terminal.

An embodiment of the present disclosure also provides a terminal including a body and a display screen located on the body. The body is used to achieve a purpose or intended function of the terminal. The display screen may be the one in any of the foregoing embodiments. The body includes a controller and a front device. In this embodiment, the front device is described, by way of example, as a front camera.

The front camera is located below the first display region. The controller is configured to monitor the working state of the front camera, so as to control the first display region to be in an unlit state when it is detected that the front camera is not working. However, the first display region is transparent in the unlit state, so that the normal working of the front camera is not affected. Other display regions of the display screen are independently controlled by the controller and are not affected by the working state of the front camera. That is, when the front camera is not in working, the controller controls the first display region and the second display region so that the first display region and the second display region can display as needed to realize a full screen display. In the working of the front camera, the controller controls the first display region to be unlit, that is, the area cannot display, so that the front camera is visible and does not affect the normal working of the front camera, and other display regions are independently controlled by the controller, and the display process is not affected. According to the foregoing terminal, when the terminal is in a sleep, standby or shutdown state, that is, when the entire display screen is unlit, the front camera is also in a visible state.

Figure 5:
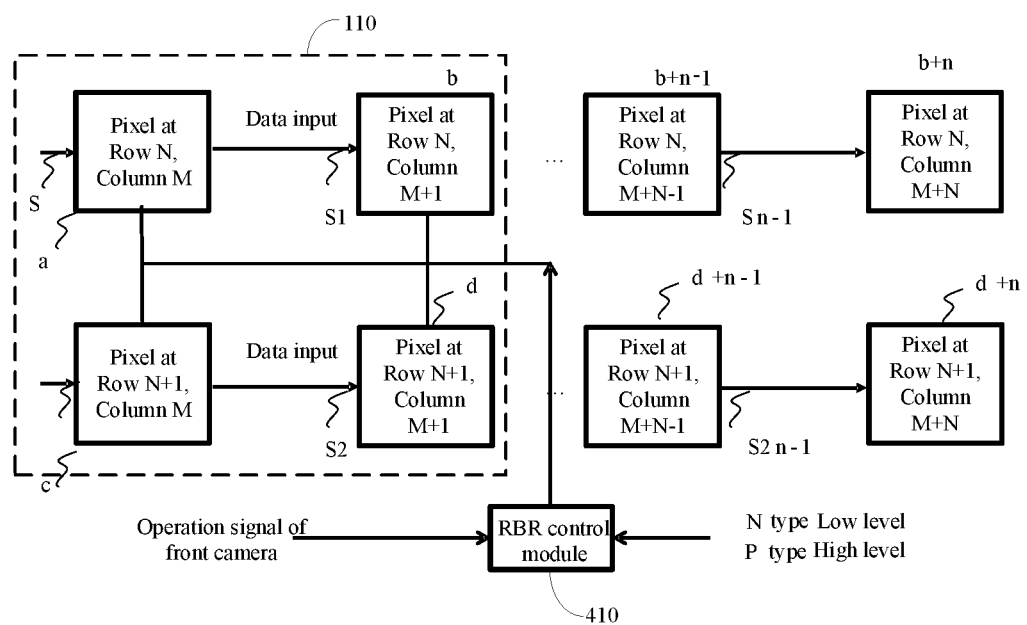
FIG. 5 is a schematic driving view of a terminal according to the embodiment.

FIG. 5 is a schematic view of driving a terminal according to the embodiment. In the embodiment, the controller includes a region-by-region control module 410. The region-by-region control module is configured to receive an working signal of the front camera, so that when the working signal is received, a control signal is outputted to control the first display region 110 so that each pixel is flash-blackened (i.e., in an unlit state). The working state of the front camera can be monitored by the controller and an working signal can be outputted when the front camera is detected. It is also possible to detect the working state of the front camera by providing a corresponding detection element so as to output an working signal when the front camera is in the working state. The control signal outputted by the region-by-region control module 410 is a level signal, and the level of the level signal needs to be determined according to the type of the pixel circuit. When the pixel circuit is an n-type circuit (that is, an n-type thin film transistor is employed), the control signal is a low level signal, and when the pixel circuit is a P-type circuit (that is, a P-type thin film transistor), the control signal is a high level signal.

According to the foregoing terminal, when the camera is not in use, the screen is normally displayed, and the region-by-region control module 410 is in a standby state and does not work. The first display region 110 above the camera and other display regions are not affected and can work normally. When the camera is activated, after receiving the camera signal, the region-by-region control module 410 sends the corresponding control signal (high level or low level signal) directly to the pixels (i.e., the pixels in the first display region 110) in the area above the camera, pixels in the first display region 110 are turned off (i.e., each pixel in the first display region 110 is flash-blackened), and the other display regions can still display normally without being affected.

Figure 6:
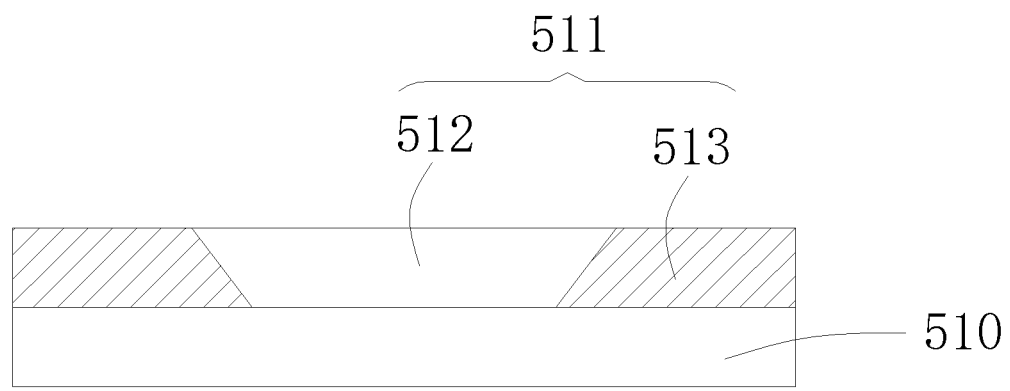
FIG. 6 is a schematic view of a first display region of a display screen according to another embodiment.
Figure 7:
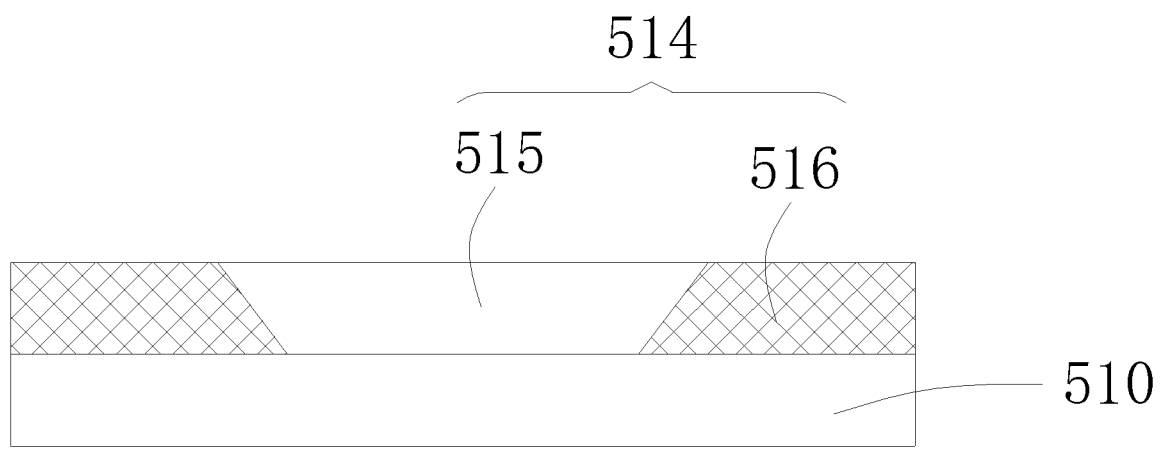
FIG. 7 is a schematic view of a second display region of a display screen according to the other embodiment.
Figure 8:
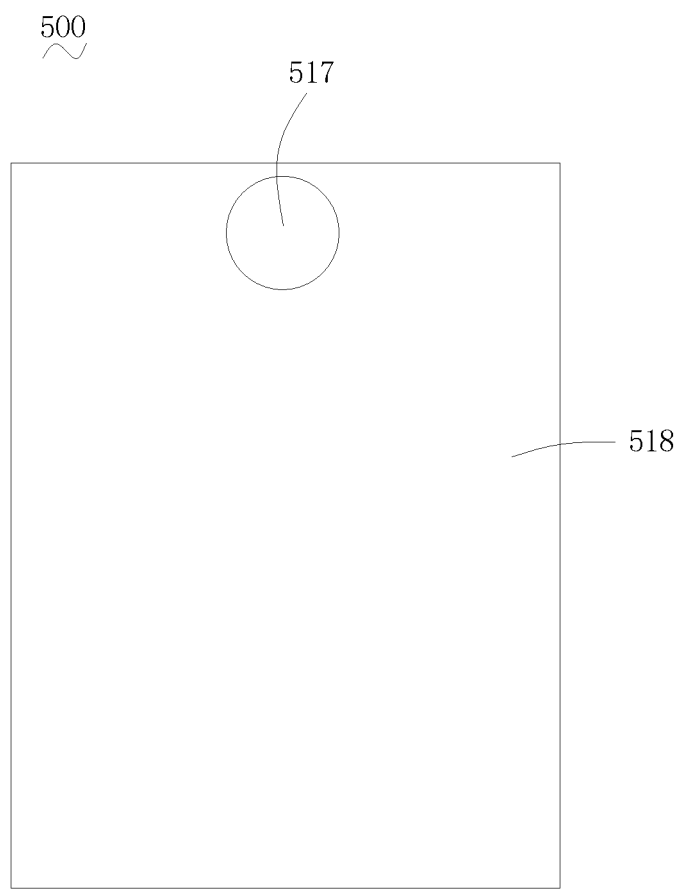
FIG. 8 is a schematic view of a display screen according to the other embodiment.

In another embodiment, referring to FIGS. 6-8, a display screen 500 of an embodiment includes a conductive layer 510 and a first-type light-emitting unit 511 formed on the conductive layer 510. The first-type light-emitting unit 511 includes a pixel region 512 and an electro-variable light transmittance material 513 located on a periphery of the pixel region 512. When powered on, the electro-variable light transmittance material 513 is light absorbable; and when powered off, the electro-variable light transmittance material 513 is light transmissive.

On the basis of the foregoing embodiments, the display screen 500 further includes a second-type light-emitting unit 514 including a pixel region 515 and a pixel-defining layer 516 located on a periphery of the pixel region 515. The pixel-defining layer 516 does not contain an electro-variable light transmittance material. The plurality of first-type light-emitting unit 511 are gathered into a first display region 517, and the plurality of second-type light-emitting unit 514 are gathered into a second display region 518.

Since the first-type light-emitting unit 511 has the electro-variable light transmittance material 513, when the conductive layer 510 is powered on, the pixel region 512 of the first-type light-emitting unit 511 emits light, the electro-variable light transmittance material 513 absorbs light, thus reducing the influence of the ambient light, so that the picture is displayed normally. Thus, no polarizer is required for the first display region 517 of the display screen 500, thereby achieving an improvement of the display screen 500.

Since the first display region 517 of the display screen 500 of the foregoing embodiment contains the electro-variable light transmittance material 513, the first display region 517 can normally display when the conductive layer 510 is powered on; and when the conductive layer 510 is powered off, the pixel region 512 of the first-type light-emitting unit 511 does not emit light, and the electro-variable light transmittance material 513 has light transparency, whereby the first display region 517 becomes nearly transparent, thereby allowing ambient light to smoothly irradiate through the first display region 517 of the display screen 500. In this way, the front camera can be positioned below (behind) the display screen 500 and aligned with the first display region 517, whereby when the front camera is used, by powering off the conductive layer 510 of the first display region 517 alone, the imaging can be done with the front camera. Therefore, the display screen 500 according to the embodiment does not have to reserve a position for the front camera, and can even omit the non-display region of the display screen in the prior art, thereby increasing the screen-to-body ratio, and optimizing the user experience.

On the basis of the foregoing embodiments, no polarizer is provided above the first display region 517. Thus, when the front camera is used, the ambient light irradiated into the front camera can be further enhanced, and the imaging quality can be further improved.

On the basis of the foregoing embodiments, the electro-variable light transmittance material 513 is one selected from the group consisting of polyaniline, polythiophene, and polythiophene derivative. For one thing, when the conductive layer 510 is powered on, electro-variable light transmittance materials such as polyaniline, polythiophene, and polythiophene derivatives can reduce the influence of external light as they are light absorbable. In the case the conductive layer 510 is powered off, the electro-variable light transmittance material such as polyaniline, polythiophene, and polythiophene derivative are light transmissive, and the transmittance of these materials is great, so that the first display region 517 is nearly transparent, as such, the ambient light can be irradiated through smoothly and the camera can image normally. For another thing, polyaniline, polythiophene, and polythiophene derivatives are all organic materials, and are provided outside the pixel region 512 of the first-type light-emitting unit 511, and serve to protect the pixel region 512 of the first-type light-emitting unit 511, and the above organic materials also have certain flexibility and can fit well with the pixel region 512.

On the basis of the foregoing embodiments, the polythiophene derivative is 1,3-dimethylpolythiophene or 1,4-p-dimethylpolythiophene. When the conductive layer 510 is or is powered off, the transmittance of the two polythiophene derivatives can be rapidly and stably changed by an applied electric field, the first display region 517 of the display screen 500 can be rapidly switched between the image-displaying and the light-transmitting states.

On the basis of the foregoing embodiments, the electro-variable light transmittance material 513 is less than the pixel region 512. This makes it possible to make full use of the space of the first display region 517 of the display screen 500, and when the conductive layer 510 is powered on, the pixel region 512 emits light so that the first display region 517 normally displays images. Whereas when the conductive layer 510 is powered off, the electro-variable light transmittance material 513 is nearly transparent while the pixel region 512 is nearly transparent, so that the first display region 517 become nearly transparent, so the ambient light can be smoothly irradiated through the first display region 517.

On the basis of the foregoing embodiments, the electro-variable light transmittance material 513 forms a pixel-defining layer of the first-type light-emitting unit 511. That is, the electro-variable light transmittance material 513 is used instead of the pixel-defining layer of the first-type light-emitting unit 511. In this way, the electro-variable light transmittance material 513 can also serve to define the pixel region 512 of the first-type light-emitting unit 511 while functioning as described above.

On the basis of the foregoing embodiments, as shown in FIG. 6, the side of the pixel-defining layer of the first-type light-emitting unit 511 adjacent to the pixel region 512 is a slope surface extending gradually away from the pixel region 512 as the pixel-defining layer is gradually away from the conductive layer 510, the pixel-defining layer of the first-type light-emitting unit 511 defines a cross-sectional shape of the pixel region 512 as an inverted trapezoid, the purpose of which is to prevent the light emission of the OLED from being greatly absorbed.

In the embodiment, the thickness of the pixel-defining layer of the first-type light-emitting unit 511 is about 4 μm to about 8 μm.

Figure 9:
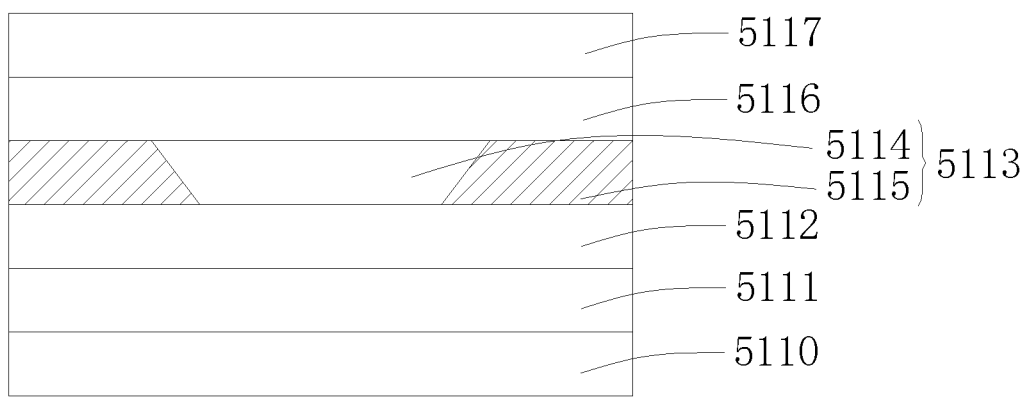
FIG. 9 is a side view of a first display region of a display screen that is powered on according to the other embodiment.

Referring to FIG. 9, a display screen 519 according to another embodiment includes a circuit layer 5110, a planarization layer 5111, an anode 5112, a first-type light-emitting unit 5113, a cathode 5116, and a thin film encapsulation (TFE) layer 5117 which are sequentially stacked in a first display region.

The first-type light-emitting unit 5113 includes a pixel region 5114 and an electro-variable light transmittance material 5115 located on a periphery of the pixel region 5114.

Figure 10:
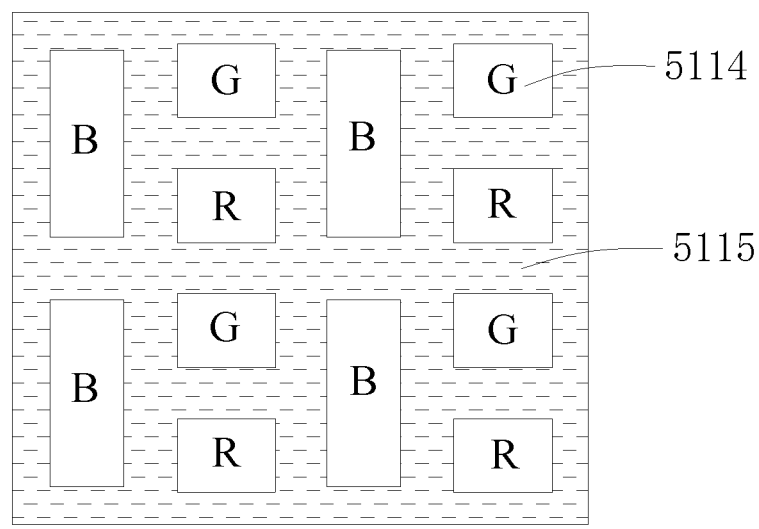
FIG. 10 is a top view of a first display region of a display screen that is powered on according to the other embodiment.

Also referring to FIG. 10, when powered on, the pixel region 5114 of the first-type light-emitting unit 5113 is enabled to emit light, and the display screen 500 is lit. Also, the electro-variable light transmittance material 5115 is light absorbable, and the light transmittance of the electro-variable light transmittance material 5115 is less than 10%, and the influence of ambient light can be reduced, thereby displaying an image normally.

Figure 11:
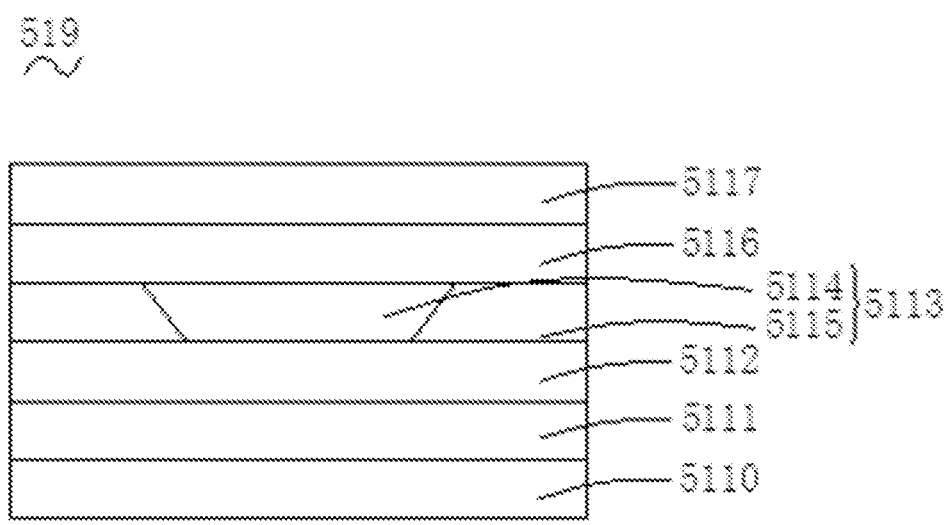
FIG. 11 is a side view of a first display region of a display screen that is powered off according to the other embodiment.
Figure 12:
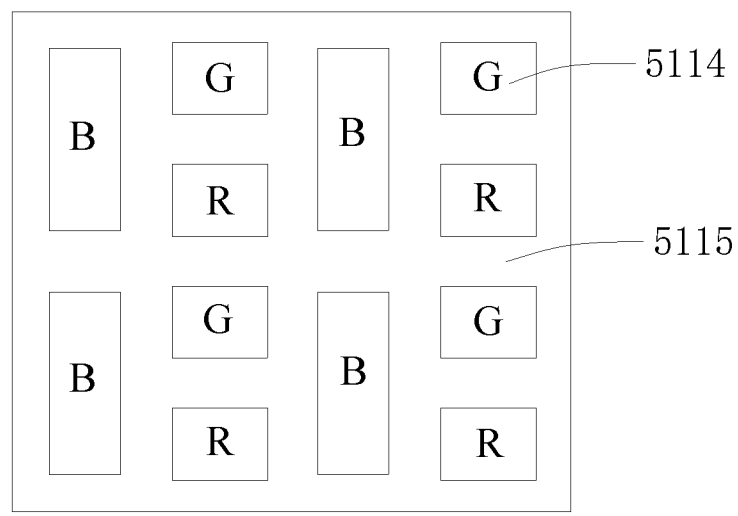
FIG. 12 is a top view of a first display region of a display screen that is powered off according to the other embodiment.

Referring to FIGS. 11 and 12, when powered off, the electro-variable light transmittance material 5115 is light transmissive. At this time, the transmittance of the electro-variable light transmittance material 5115 is greater than 90%. Thus, ambient light can be smoothly irradiated through the first display region 517 of the display screen 519.

Figure 13:
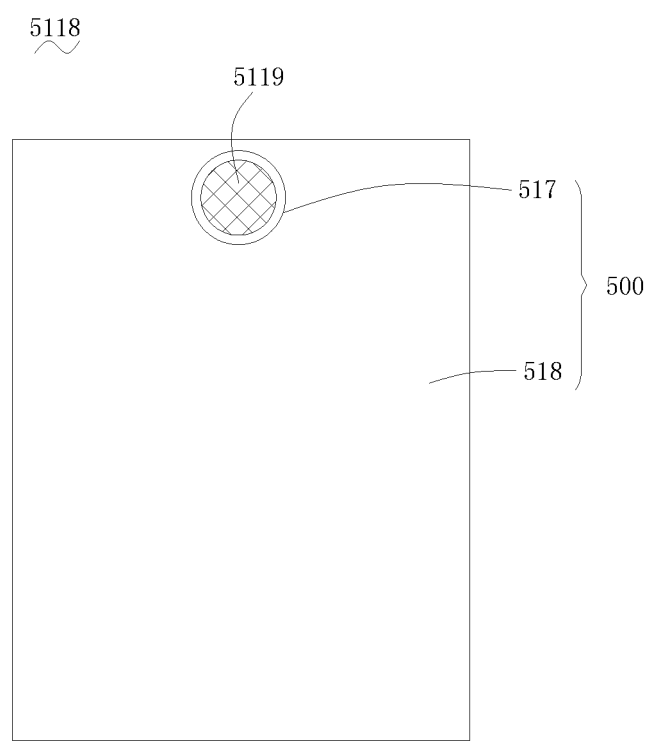
FIG. 13 is a schematic view of an electronic device according to the other embodiment.

Further referring to FIG. 13, an electronic device 5118 according to an embodiment includes a display screen 500 and an under-screen photosensitive module 5119 according to the above embodiment.

Further referring to FIGS. 6 to 8, the display screen 500 includes a conductive layer 510 and a first-type light-emitting unit 511 formed on the conductive layer 510. The first-type light-emitting unit 511 includes a pixel region 512 and an electro-variable light transmittance material 513 located on a periphery of the pixel region 512. When powered on, the electro-variable light transmittance material 513 is light absorbable; and when powered off, the electro-variable light transmittance material 513 is light transmissive.

In the electronic device 5118 of the present disclosure, since the first-type light-emitting unit 511 of the display screen 500 includes the electro-variable light transmittance material 513, when the conductive layer 510 is powered on, the pixel region 512 of the first-type light-emitting unit 511 is enabled to emit light, and the electro-variable light transmittance material 513 reduces the influence of ambient light by being light absorbable, thereby displaying an image normally. Thus, a polarizer is not required in the display screen 500 of the electronic device 5118, thereby achieving an improvement in the display screen 500.

On the basis of the foregoing embodiments, the under-screen photosensitive module 5119 is at least one of a photoelectric sensor and a camera.

In the electronic device 5118 of the present disclosure, since the first display region 517 of the display screen 500 contains the electro-variable light transmittance material 513, the first display region 517 can normally display when the conductive layer 510 is powered on. When the conductive layer 510 is powered off, the pixel region 512 of the first-type light-emitting unit 511 does not emit light, and the electro-variable light transmittance material 513 is light transmissive, whereby the first display region 517 becomes nearly transparent, thereby allowing ambient light to smoothly irradiate through the first display region 517 of the display screen 500. Thus, the under-screen photosensitive module 5119, which is at least one of the photoelectric sensors and the camera, may be located below the display screen 500 and aligned with the first display region 517. Therefore, the display screen 500 according to the present disclosure does not have to reserve a position for the under-screen photosensitive module 5119, and can even omit the non-display region of the display screen 500 in the prior art, thereby increasing the screen-to-body ratio, and optimizing the user experience.

Figure 14:
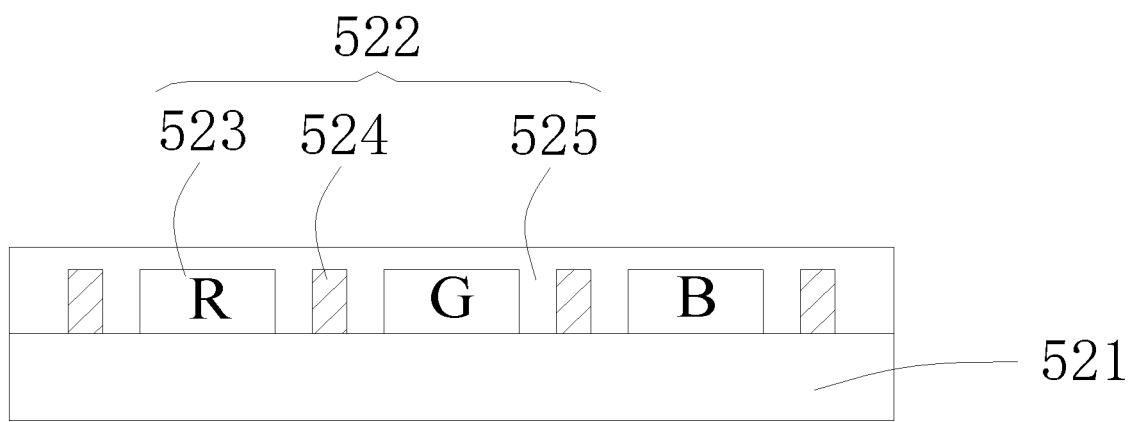
FIG. 14 is a side view of a first display region of a display screen according to the other embodiment.
Figure 15:
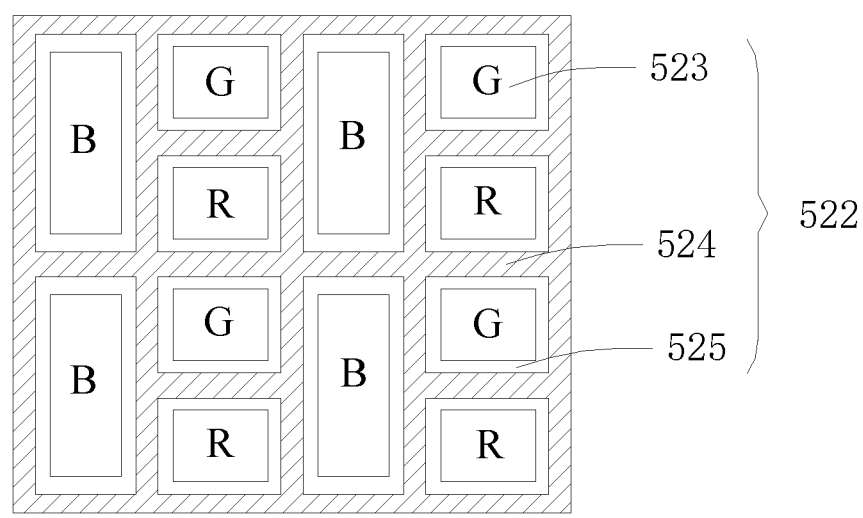
FIG. 15 is a top view of a first display region of a display screen according to the other embodiment.
Figure 16:
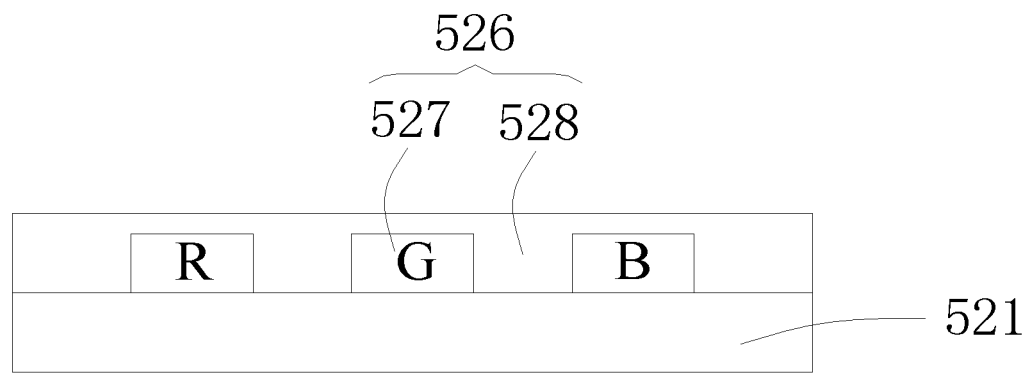
FIG. 16 is a side view of a second display region of a display screen according to the other embodiment.

In the other embodiment, referring to FIGS. 14-16, a display screen 500 of an embodiment includes a conductive layer 521 and a first-type light-emitting unit 522 formed on the conductive layer 521. The first-type light-emitting unit 522 includes a pixel region 523 and an electro-variable light transmittance material 524 located on a periphery of the pixel region 523. When powered on, the electro-variable light transmittance material 524 is light absorbable; and when powered off, the electro-variable light transmittance material 524 is light transmissive.

Since the first-type light-emitting unit 522 has the electro-variable light transmittance material 524, when the conductive layer 521 is powered on, the pixel region 523 of the first-type light-emitting unit 522 emits light, the electro-variable light transmittance material 524 reduces the influence of ambient light due to light absorption, thereby displaying an image normally. Thus, it is possible to omit the polarizer in the display screen 500, thereby realizing the improvement of the display screen 500.

On the basis of the foregoing embodiment, a pixel-defining layer 525 is located on a periphery of the pixel region 523, and an electro-variable light transmittance material 524 is embedded in the pixel-defining layer 525 and is in contact with the conductive layer 521. The purpose of this arrangement is to enable a current to be conducted to the electro-variable light transmittance material 524 through the conductive layer 521 when powered on, and to cut off the current when powered off, thereby controlling the transmittance of the electro-variable light transmittance material 524.

On the basis of the foregoing embodiment, as shown in FIG. 15, an electro-variable light transmittance material 524 is provided between the pixel-defining layer 525 and the pixel region 523. The purpose of this arrangement is to distribute the electro-variable light transmittance material 524 more uniformly so that when the conductive layer 521 is powered on, the uniform distribution of the electro-variable light transmittance material 524 enables the pixel region 523 of the first-type light-emitting unit 522 to uniformly emit light, thereby improving the display effect of the display screen. Also, when the conductive layer 521 is powered off, the uniformly distributed electro-variable light transmittance material 524 enables ambient light to uniformly irradiate through an area of the display screen 500 where the electro-variable light transmittance material 524 is distributed.

On the basis of the foregoing embodiments, the electro-variable light transmittance material 524 is formed as a strip, the ratio of the width of the strip to the width of the pixel-defining layer 525 is between 1:2 and 3:4. In the foregoing range of the ratio of the widths, the display effect of the display screen can be enhanced when the conductive layer 521 is powered on, and enables the ambient light to uniformly irradiate through the area on the display screen 500 where the strips are distributed when the conductive layer 521 is powered off.

On the basis of the previous embodiments, the width of the strip is about 4 μm to about 10 μm. For one thing, when the conductive layer 521 is powered on, the display effect of the display screen is sufficiently ensured, while when the conductive layer 521 is powered off, the transmission effect of the ambient light is sufficiently ensured. For another thing, the manufacturing process of the strip having the width about 4 μm to about 10 μm is simple, and damage to the pixel region 523 during the manufacturing process is avoided.

On the basis of the foregoing embodiments, the electro-variable light transmittance material 524 is one selected from the group consisting of polyaniline, polythiophene, and polythiophene derivative, or one of tungsten oxide, titanium oxide, and nickel oxide.

In the case of organic variable light transmittance material such as polyaniline, polythiophene, and polythiophene derivatives, for one thing, when the conductive layer 521 is powered on, the electro-variable light transmittance material such as polyaniline, polythiophene, and polythiophene derivative are light absorbable and the influence of the external light is reduced; when the conductive layer 521 is powered off, the electro-variable light transmittance material such as polyaniline, polythiophene, and polythiophene derivative appear to be light transmissive, and the transmittance of these materials is great so that the region in which these materials are located is nearly transparent, so that ambient light can be irradiated through smoothly and the camera can image normally. For another thing, polyaniline, polythiophene, and polythiophene derivatives are all organic materials, and are provided outside the pixel region 523 of the first-type light-emitting unit 522, and serve to protect the pixel region 523 of the first-type light-emitting unit 522, also, it has certain flexibility and can fit well with the pixel region 523.

In the other embodiment, the polythiophene derivative is 1,3-dimethylpolythiophene or 1,4-p-dimethylpolythiophene. When the conductive layer 521 is or is powered off, the transmittance of the two polythiophene derivatives can be rapidly and stably changed by an applied electric field. The display screen 500 can be rapidly switched between the image-displaying and the light-transmitting states, and has the advantages of low cost, good optical quality and good cycle reversibility.

In particular, the inorganic electro-variable light transmittance material such as tungsten oxide, titanium oxide and nickel oxide have the advantages of high color efficiency, good reversibility, short response time, long service life and low cost, and is advantageous for use in the display screen 500 of the present disclosure.

On the basis of the foregoing embodiments, referring also to FIG. 8, the display screen 500 further includes a second-type light-emitting unit 526 including a pixel region 527 and a pixel-defining layer 528 located on a periphery of the pixel region 527, and does not contain the electro-variable light transmittance material. The plurality of first-type light-emitting units 522 are gathered into a first display region 517, and the plurality of second-type light-emitting unit 526 are gathered into a second display region 518.

Since the first display region 517 of the display screen 500 of the foregoing embodiment contains the electro-variable light transmittance material 524, the first display region 517 can normally display when the conductive layer 521 is powered on; and when the conductive layer 521 is powered off, the pixel region 527 of the first-type light-emitting unit 522 does not emit light, and the electro-variable light transmittance material 524 is light transmissive, whereby the first display region 517 becomes nearly transparent, thereby allowing ambient light to smoothly irradiate through the first display region 517 of the display screen 500. In this way, the front camera may be positioned below the display screen 500 and aligned with the first display region 517, whereby when the front camera is used, by powering off the conductive layer 521 of the first display region 517 alone, the imaging can be done with the front camera. Therefore, the display screen 500 according to the embodiment does not have to reserve a position for the front camera, and can even omit the non-display region of the display screen in the prior art, thereby increasing the screen-to-body ratio, and optimizing the user experience.

On the basis of the foregoing embodiments, no polarizer is provided above the first display region 517. Thus, when the front camera is used, the ambient light irradiated into the front camera can be further enhanced, and the imaging quality can be further improved.

Figure 17:
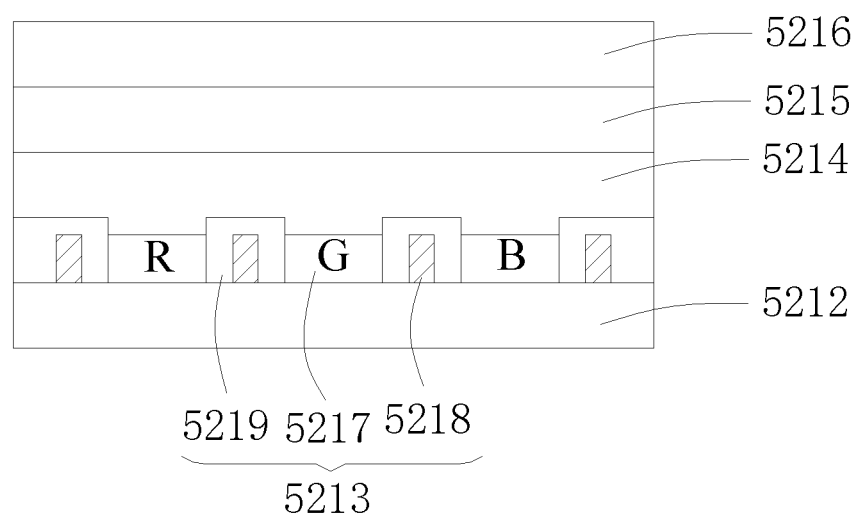
FIG. 17 is a side view of a first display region of a display screen that is powered on according to the other embodiment.

Further referring to FIG. 17, the display screen 500 includes an array substrate 5212, a first-type light-emitting unit 5213, a thin film encapsulation layer 5214, a touch screen 5215, and a protective film 5216 sequentially laminated on the first display region.

The first-type light-emitting unit 5213 includes a pixel region 5217, an electro-variable light transmittance material 5218 located on a periphery of the pixel region 5217, and a pixel-defining layer 5219 located on a periphery of the pixel region 5217.

Figure 18:
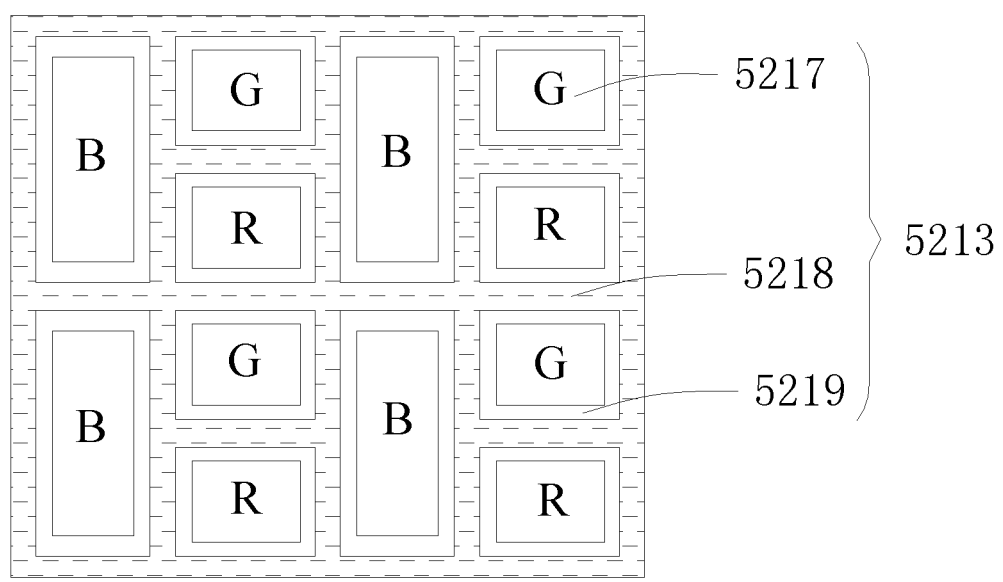
FIG. 18 is a top view of a first display region of a display screen that is powered on according to the other embodiment.

Also referring to FIG. 18, when powered on, the pixel region 5217 of the first-type light-emitting unit 5213 is enabled to emit light, and the display screen 500 is lit. Also, the electro-variable light transmittance material 5218 is light absorbable, and the light transmittance of the electro-variable light transmittance material 5642 is less than 10%, so that the influence of ambient light can be reduced, thereby displaying an image normally.

Figure 19:
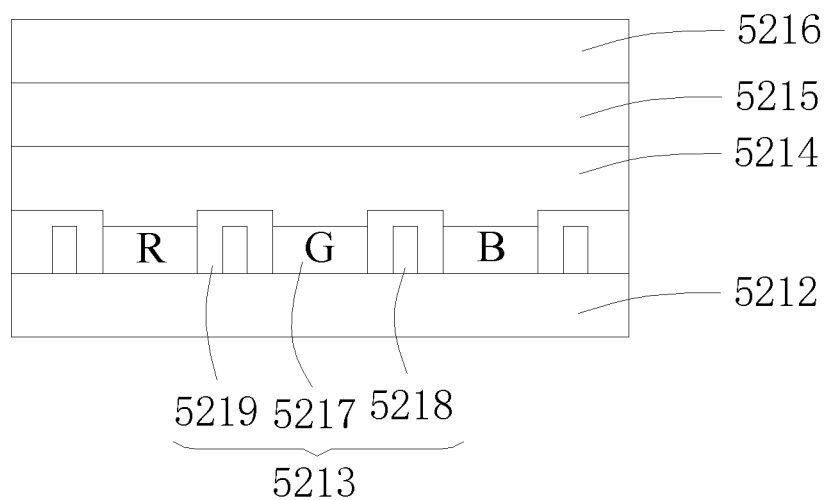
FIG. 19 is a side view of a first display region of a display screen that is powered off according to the other embodiment.
Figure 20:
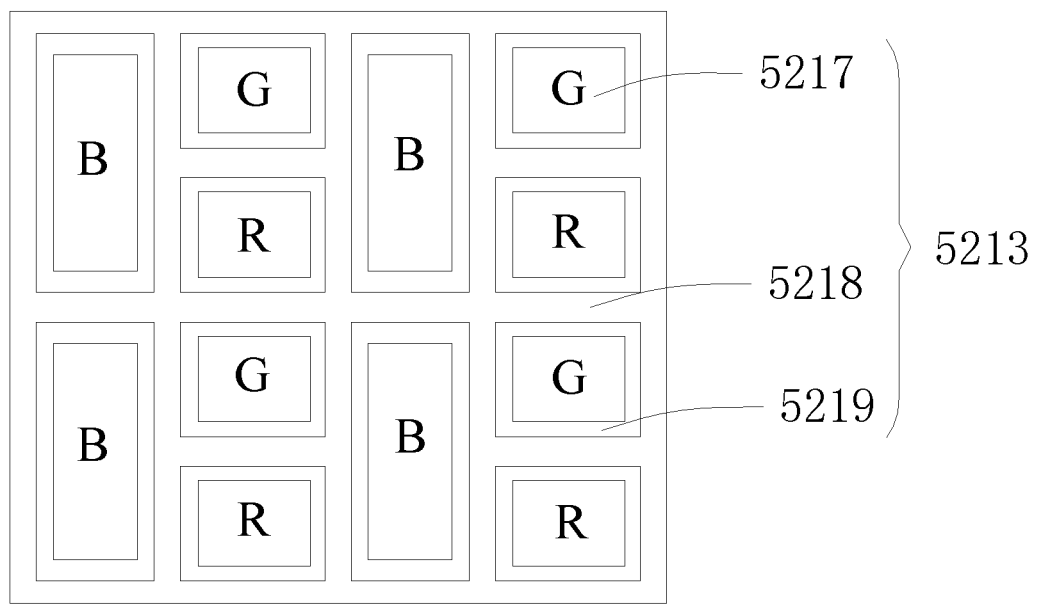
FIG. 20 is a top view of a first display region of a display screen that is powered off according to the other embodiment.

Also referring to FIGS. 19 and 20, the electro-variable light transmittance material 5218 is light transmissive when powered off. Then the transmittance of the electro-variable light transmittance material 5218 is greater than 90%. Thus, ambient light can be smoothly irradiated through the first display region of the display screen 500.

Figure 21:
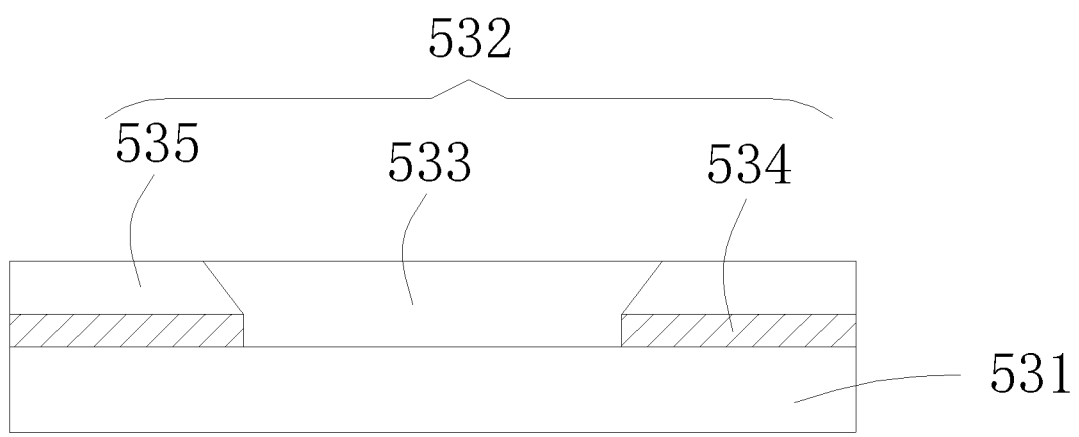
FIG. 21 is a side view of a first display region of a display screen according to the other embodiment.
Figure 22:
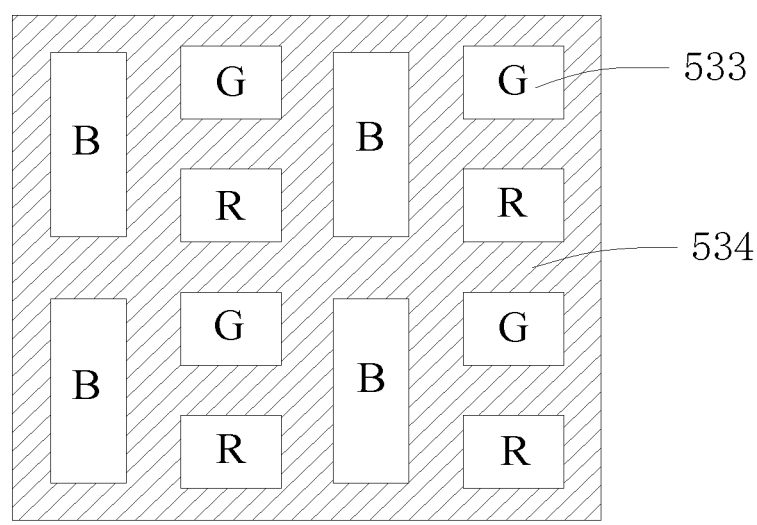
FIG. 22 is a bottom view of a first display region of a display screen according to the other embodiment.
Figure 23:
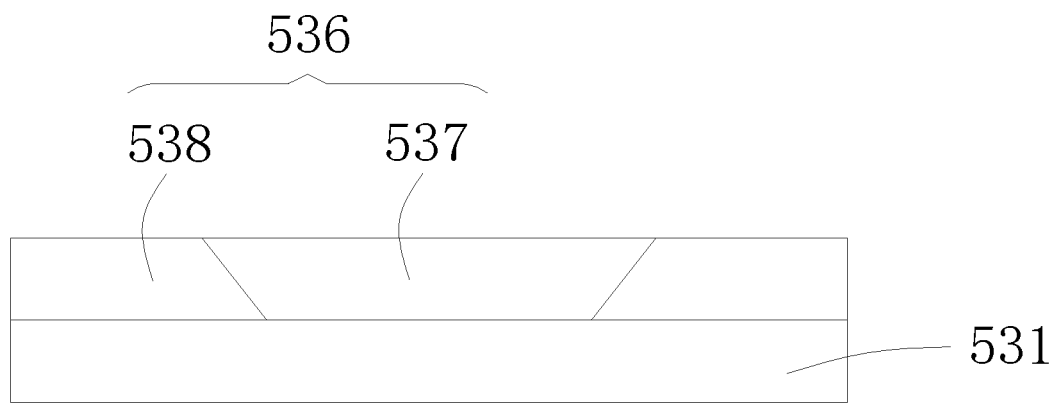
FIG. 23 is a side view of a second display region of a display screen according to the other embodiment.

In the other embodiment, referring to FIGS. 21-23, the display screen 500 includes a conductive layer 531 and a first-type light-emitting unit 532 formed on the conductive layer 531.

The first-type light-emitting unit 532 includes a pixel region 533 and an electro-variable light transmittance material 534 located on a periphery of the pixel region 533. When powered on, the electro-variable light transmittance material 534 is light absorbable; and when powered off, the electro-variable light transmittance material 534 is light transmissive.

Since the first-type light-emitting unit 532 has the electro-variable light transmittance material 534, when the conductive layer 531 is powered on, the pixel region 533 of the first-type light-emitting unit 532 emits light, the electro-variable light transmittance material 534 reduces the influence of ambient light due to its light absorption, thereby displaying an image normally.

Thus, it is possible to omit the polarizer in the display screen 500, thereby realizing the improvement of the display screen 500.

On the basis of the foregoing embodiments, in the first-type light-emitting unit 532, a transparent pixel-defining layer 535 is provided on the electro-variable light transmittance material 534. That is, the electro-variable light transmittance material 534 and the pixel-defining layer 535 are laminated. The electro-variable light transmittance material 534 absorbs or transmits light according to a powering state, and the pixel-defining layer 535 serves as a spacing pixel, and the structure in which both are superimposed combines the advantages of both, a further improvement of the display screen 500 is achieved.

On the basis of the foregoing embodiments, the thickness of the electro-variable light transmittance material 534 is less than the thickness of the pixel-defining layer 535. Such arrangement can avoid affecting the buffering effect of the pixel-defining layer 535 due to the too small thickness of the pixel-defining layer 535.

On the basis of the foregoing embodiments, the thickness of the electro-variable light transmittance material 534 is about 1 µm to about 3 µm, and the thickness of the pixel-defining layer 535 is about 3 µm to about 5 µm. The inventors of the present disclosure have found that when the thicknesses of the electro-variable light transmittance material 534 and the pixel-defining layer 535 are set to the above values, respectively, the advantages of both can be combined and the effect is optimal. That is, when the conductive layer 531 is powered on, the electro-variable light transmittance material 534 is light absorbable, and the screen can normally display; and when the conductive layer 531 is powered off, the light transmittance of the electro-variable light transmittance material 534 can meet the imaging requirement. Also, the buffering effect of the pixel-defining layer 535 can protect the pixel region 533.

On the basis of the foregoing embodiments, referring to FIG. 8, the display screen 500 further includes a second-type light-emitting unit 536. The second-type light-emitting unit 536 includes a pixel region 537 and a pixel-defining layer 538 located on a periphery of the pixel region 537. The pixel-defining layer 538 does not contain the electro-variable light transmittance material. The plurality of the first-type light-emitting units 532 are gathered into a first display region 517, and the plurality of second-type light-emitting unit 536 are gathered into a second display region 518.

Since the first display region 517 of the display screen 500 of the foregoing embodiment contains the electro-variable light transmittance material 534, the first display region 517 can normally display the image when the conductive layer 531 is powered on; and when the conductive layer 531 is powered off, the pixel region 533 of the first-type light-emitting unit 532 does not emit light, and the electro-variable light transmittance material 534 is light transmissive, whereby the first display region 517 becomes nearly transparent, thereby allowing ambient light to smoothly irradiate through the first display region 517 of the display screen 500. In this way, the front camera may be positioned below the display screen 500 and aligned with the first display region 517, whereby when the front camera is used, only by powering off the conductive layer 531 of the first display region 517 alone, the imaging can be done with the front camera. Therefore, the display screen 500 according to the embodiment does not have to reserve a position for the front camera, and can even omit the non-display region of the display screen in the prior art, thereby increasing the screen-to-body ratio, and optimizing the user experience.

On the basis of the foregoing embodiments, no polarizer is provided above the first display region 517. Thus, when the front camera is used, the ambient light irradiated into the front camera can be further enhanced, and the imaging quality can be further improved.

On the basis of the foregoing embodiments, the electro-variable light transmittance material 524 is one selected from the group consisting of polyaniline, polythiophene, and polythiophene derivative, or one of tungsten oxide, titanium oxide, and nickel oxide.

In the case of organic variable light transmittance material such as polyaniline, polythiophene, and polythiophene derivatives, for one thing, when the conductive lay 531 is powered on, the influence of the external light is reduced as the electro-variable light transmittance material such as polyaniline, polythiophene, and polythiophene derivative are light absorbable; in the case the conductive lay 531 is powered off, the electro-variable light transmittance material such as polyaniline, polythiophene, and polythiophene derivative are light transmissive, and the transmittance of these materials is great so that the first display region 517 is nearly transparent, so that ambient light can smoothly irradiate through and the camera can image normally. For another thing, polyaniline, polythiophene and polythiophene derivatives are all organic materials and are located outside the pixel region 533 of the first-type light-emitting unit 532, and serve to protect the pixel region 533 of the first-type light-emitting unit 532, also, the above organic materials have certain flexibility and can fit well with the pixel region 533.

In particular, the inorganic electro-variable light transmittance material such as tungsten oxide, titanium oxide, and nickel oxide have the advantages of high color efficiency, good reversibility, short response time, long service life and low cost, and is advantageous for use in the display screen 500 of the present disclosure.

On the basis of the foregoing embodiments, the polythiophene derivative is 1,3-dimethylpolythiophene or 1,4-p-dimethylpolythiophene. When the conductive layer 531 is or is powered off, the transmittance of the two polythiophene derivatives can be rapidly and stably changed by an applied electric field, the display screen 500 can be rapidly switched between the image-displaying and the light-transmitting states. Also, it has the advantages of low cost, good optical quality and good cycle reversibility.

Figure 24:
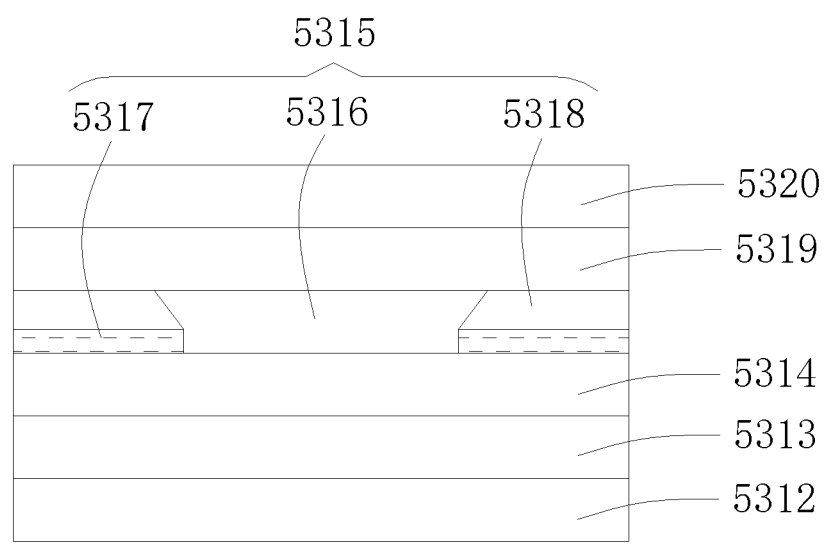
FIG. 24 is a side view of a first display region of a display screen that is powered on according to the other embodiment.

Referring to FIG. 24, the display screen 500 includes a trace layer 5312, a planarization layer 5313, an anode 5314, a first-type light-emitting unit 5315, a cathode 5319, and a thin film encapsulation layer 5320 laminated in sequence in a first display region.

The first-type light-emitting unit 5315 includes a pixel region 5316 and an electro-variable light transmittance material 5317 located on a periphery of the pixel region 5316.

Figure 25:
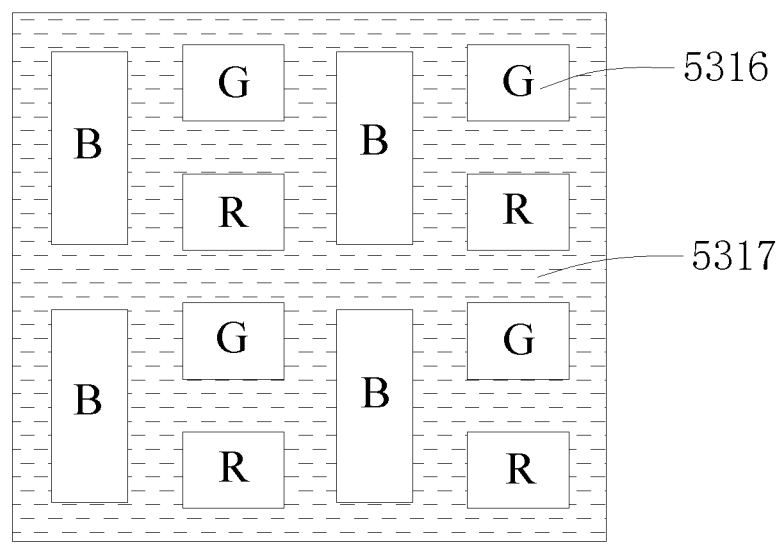
FIG. 25 is a top view of a first display region of a display screen that is powered on according to the other embodiment.

Also referring to FIG. 25, when powered on, the pixel region 5316 of the first-type light-emitting unit 5315 is enabled to emit light, and the display screen 500 is lit. Also, the electro-variable light transmittance material 5317 is light absorbable, and the light transmittance of the electro-variable light transmittance material 5317 is less than 10%, and the influence of ambient light can be reduced, thereby displaying images normally.

Figure 26:
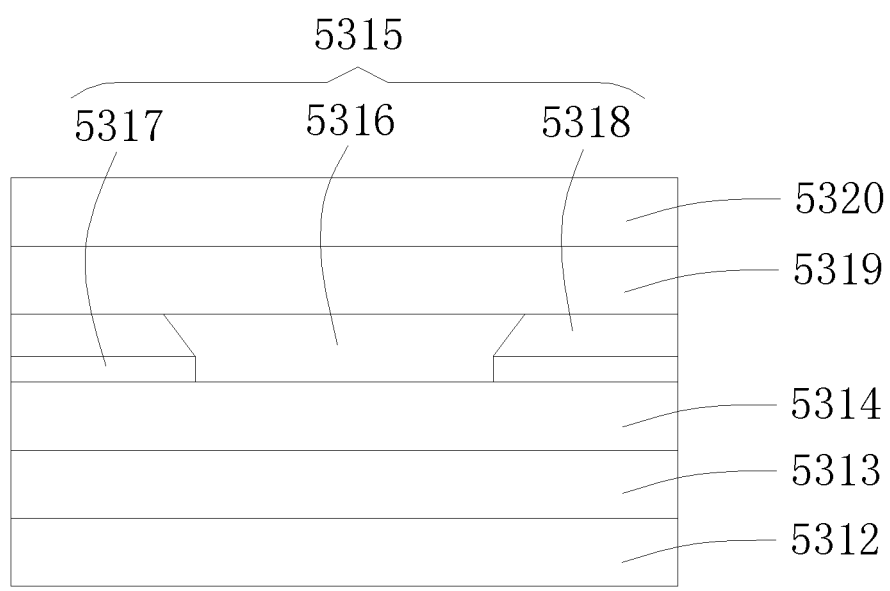
FIG. 26 is a side view of a first display region of a display screen that is powered off according to the other embodiment.
Figure 27:
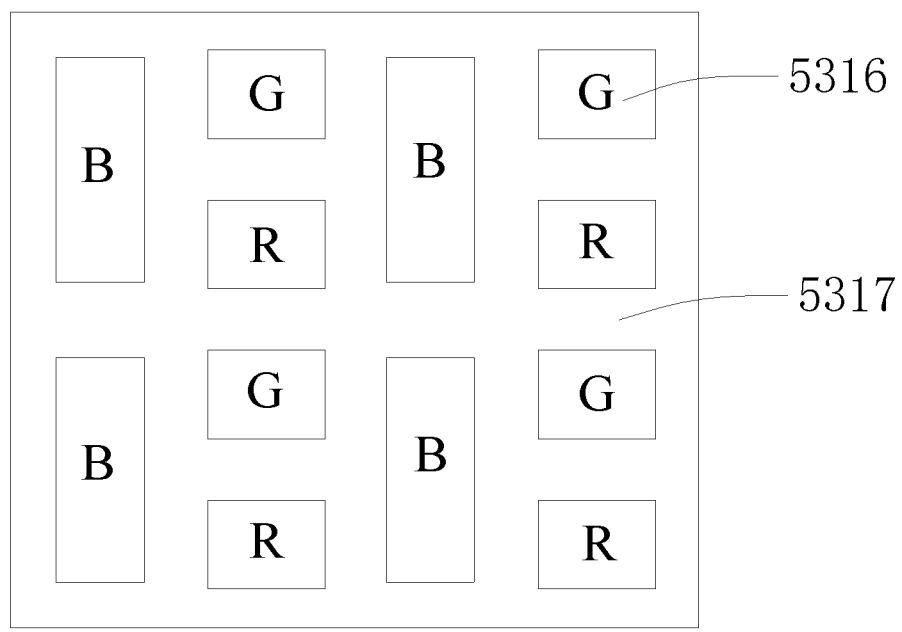
FIG. 27 is a top view of a first display region of a display screen that is powered off according to the other embodiment.

Referring to FIGS. 26 and 27, when powered off, the electro-variable light transmittance material 5317 is light transmissive. Then the transmittance of the electro-variable light transmittance material 5317 is greater than 90%. Thus, ambient light can be smoothly irradiated through the first display region of the display screen 500.

Figure 28:
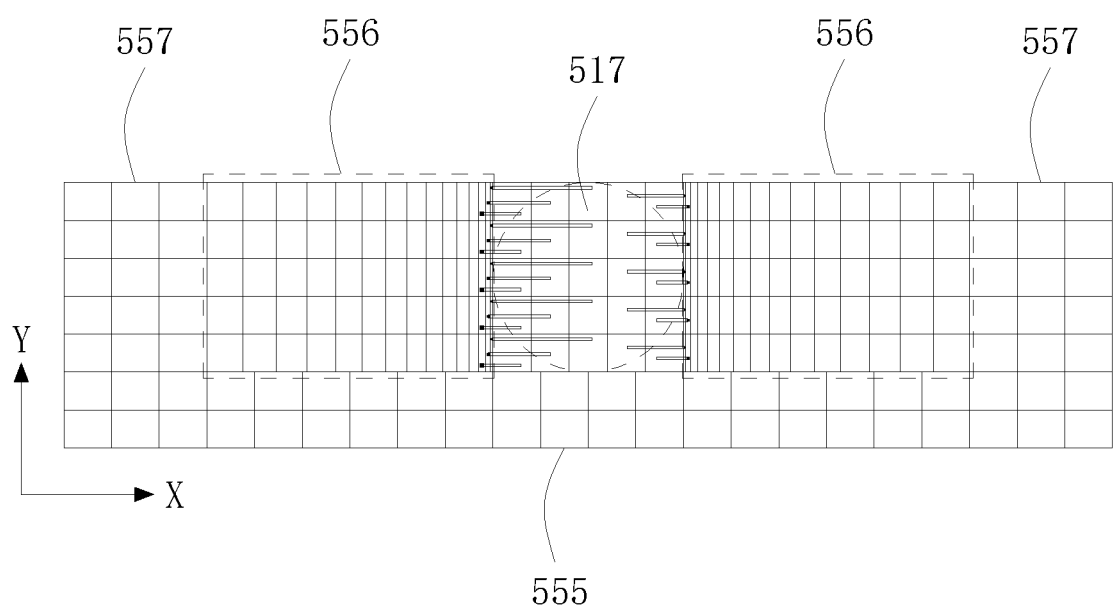
FIG. 28 is a schematic view of a layout of a drive array on a display screen according to the other embodiment.
Figure 29:
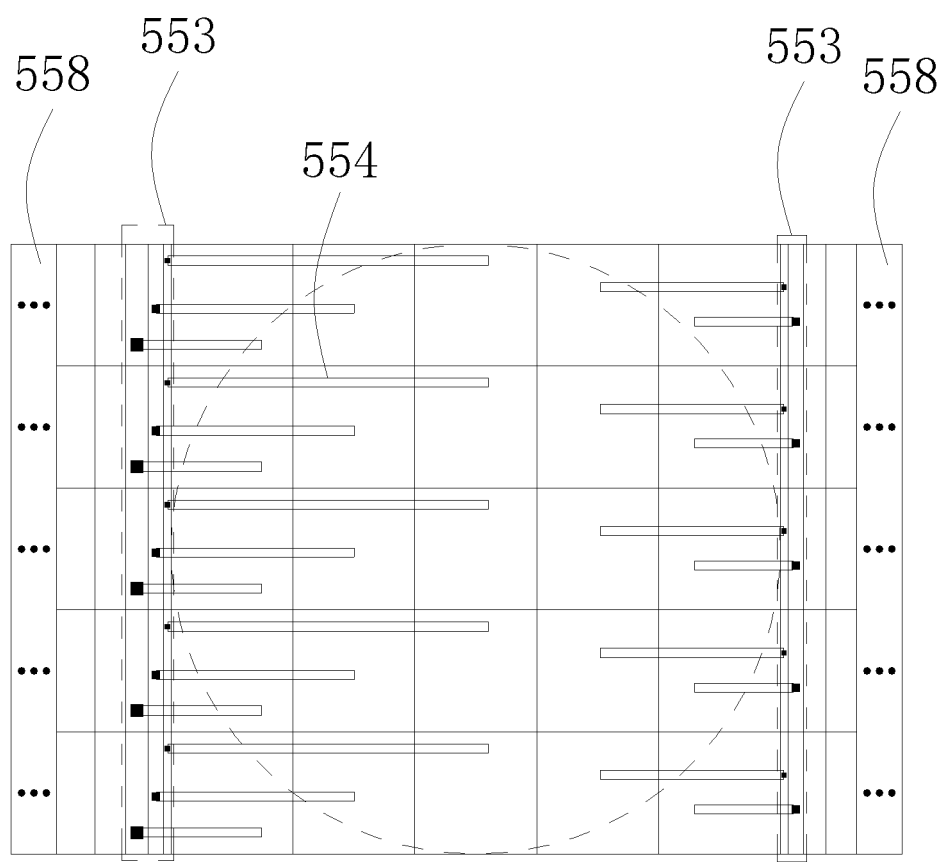
FIG. 29 is an partial enlarged view of the layout of the drive array on the display screen of FIG. 28.

In the other embodiment, referring to FIGS. 8, 28, and 29, the display screen 500 of the other embodiment has a second display region 518 and a first display region 517. The drive array 553 for pixels in the first display region 517 is not located within the first display region 517, which facilitates improving the light transmittance of the first display region 517 so that ambient light smoothly irradiates through the first display region 517 of the display screen, so as to achieve imaging.

On the basis of the foregoing embodiments, the drive array 553 for the pixels in the first display region 517 is located within the second display region 518 and is connected to the transparent anode of the pixels in the first display region 517 by a transparent trace 554. Since a portion of the transparent trace 554 is still located within the first display region 517, the drive array 553 for the pixels in the first display region 517 is thus connected to the transparent anode of the pixels in the first display region 517 via transparent traces 554, thereby avoiding the blocking of light within the first display region 517 by non-transparent traces, and improving the light transmittance of the first display region 517.

On the basis of the foregoing embodiments, the transparent trace 554 is made of at least one selected from the group consisting of ITO (indium tin oxide) and IGZO (indium gallium zinc oxide). The ITO and IGZO have excellent transparency and conductivity. For one thing, since ITO and IGZO have good transparency, blocking of light in the first display region 517 by non-transparent traces can be avoided, thereby improving the light transmittance of the first display region 517. For another thing, since ITO and IGZO have good conductivity, current can be rapidly transmitted as the transparent trace 554, so that when an image is to be displayed, the drive array 553 for the pixels in the first display region 517 can quickly drive the pixels in the first display region 517 to emit light, thereby realizing a normal display screen.

On the basis of the foregoing embodiments, the cathode in the first display region 517 is made of a transparent material. This makes it possible to further increase the light transmittance of the first display region 517.

On the basis of the foregoing embodiments, the cathode is made of phosphorus-doped ITO. Phosphorus-doped ITO has good conductivity and can meet the requirements of cathode for conductivity. Also, the phosphorus-doped ITO has good transparency and can increase the transparency of the cathode.

Both the transparent trace 554 and the cathode within the first display region 517 are made of a transparent material such that the pixels within the first display region 517 are nearly transparent. In addition, the drive array 553 for pixels in the first display region 517 is not within the first display region 517. This allows the first display region 517 as a whole to be nearly transparent, so that ambient light can be smoothly irradiated through and the camera can image normally.

Furthermore, on the basis of the foregoing embodiments, the anode of the first display region 517 is made of ITO. So as to further increase the light transmittance of the first display region 517.

On the basis of the foregoing embodiments, the drive array substrate 555 corresponding to the second display region 518 includes a first drive region 556 and a second drive region 557. The first drive region 556 is proximate to the first display region 517.

A drive array 558 for pixels in the second display region 518 is located within the first drive region 556 and the second drive region 557, and a drive array 553 for pixels in the first display region 517 is provided within the first drive region 556.

This makes it possible to shorten a distance between the drive array 553 for the pixels in the first display region 517 and the pixels in the first display region 517, thereby reducing the loss of the conductive wires, and is favorable for a uniform display screen.

On the basis of the foregoing embodiments, the area ratio of the first drive region 556 to the second drive region 557 is (3 to 9):10000. This allows the drive arrays 553 for pixels in the first display region 517 located in the first drive region 556 to be densely distributed located on a periphery of the first display region 517, thereby reducing the loss of the conductive wires, and is favorable for a uniform display screen.

Neither the first drive region 556 nor the second drive region 557 in the display screen of the present disclosure is limited to the embodiment.

On the basis of the foregoing embodiments, the ratio of the pixel density of the first display region 517 to the pixel density of the second display region 518 is (1 to 0.5):1. Thus, when an image is required to be displayed, the drive array 553 for pixels in the first display region 517 can drive pixels in the first display region 517 to emit light, thereby normally displaying the image together with the second display region 518. When imaging is required, since the drive array for pixels in the first display region is not in the first display region, the light transmittance of the first display region is improved so that ambient light is smoothly irradiated through the second display region of the display screen, thereby achieving imaging. Therefore, the display screen according to the present disclosure can eliminate the non-display region of the display screen in the prior art, expand the screen-to-body ratio, and optimizing the user experience.

When the ratio of the pixel density of the first display region 517 to the pixel density of the second display region 518 is 1:1, the effect of the display is optimal.

On the basis of the foregoing embodiments, each pixel in the first display region 517 is individually driven in a separate driving manner, which facilitates timely closing of the pixels of the first display region 517 when the camera is in working, and the pixels of the first display region 517 are turned on in time when the camera is not in working.

Furthermore, in the embodiment, the drive arrays 553 for the pixels in the first display region 517 are distributed near the left and right sides of the first display region 517, i.e., both sides in the X direction of the first display region 517 in FIG. 28. The drive array 553 for the pixels in the first display region 517 may be located along the Y direction in FIG. 28.

In the other embodiment, the density of the drive array 553 for pixels in the first display region 517 gradually decreases in a direction away from the first display region 517, and the total numbers of driving circuit on any row arranged in the X direction are equal. This enables the region to buffer the connection relationship between the pixel and the drive current. In the other embodiment, the drive circuit for the laterally arranged pixels in the first display region 517 is located in the lateral direction, so that the wires will not be crossed with each other and thereby facilitating manufacture.

Referring to FIG. 13, an electronic device 5118 according to the other embodiment includes a display screen 500 and an under-screen photosensitive module 5119.

The display screen 500 has a second display region 518 and a first display region 517. The drive array 553 for driving pixels in the first display region 517 is not within the first display region 517.

The under-screen photosensitive module 5119 can sense the incoming light passing through the display screen 500.

In the electronic apparatus of the present disclosure, when display is required, a drive array for pixels in the first display region of the display screen can drive pixels in the first display region to emit light, thereby displaying the image normally together with the second display region; and when the under-screen photosensitive module is required to work, since the drive array for pixels in the first display region is not in the first display region, the light transmittance of the first display region is improved so that ambient light smoothly irradiates through the first display region of the display screen, so as to ensure the normal working of the under-screen photosensitive module. Therefore, the display screen of the electronic device according to the present disclosure can eliminate the non-display region of the display screen in the prior art, expand the screen-to-body ratio, and optimizing the user experience.

On the basis of the foregoing embodiments, the under-screen photosensitive module 5119 is at least one of a photoelectric sensor and a camera. The under-screen photosensitive module 5119 may also be other elements.

In an embodiment, a method for manufacturing an organic light-emitting display device may include the following steps.

Figure 30:
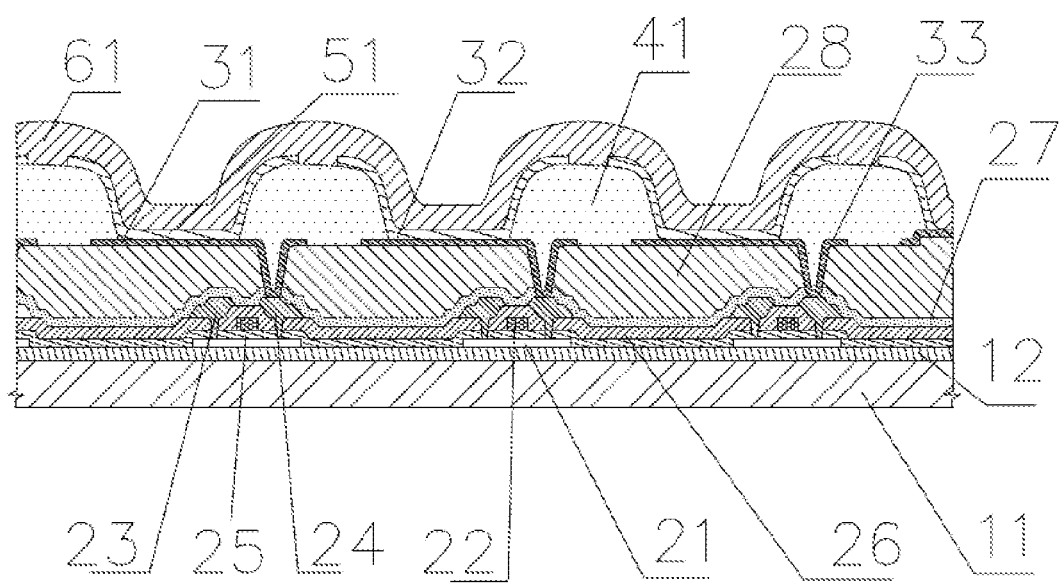
FIG. 30 is a schematic view of a layered structure of an organic light-emitting display device according to the embodiment.

Referring to FIG. 30, firstly, a substrate 11 is prepared. The substrate 11 has a first color sub-pixel region, a second color sub-pixel region, and a third color sub-pixel region. A set of the first color sub-pixel region, the second color sub-pixel region, and the third color sub-pixel region may constitute one pixel region. The substrate 11 may have a plurality of pixel regions. In the other embodiment, the sub-pixel region of the first color may be a sub-pixel region emitting red light. The second color sub-pixel region may be a sub-pixel region emitting green light. And the third color sub-pixel region may be a sub-pixel region emitting blue light.

The substrate 11 may be formed of a suitable material such as a glass material, a metal material, or a plastic material including polyethylene terephthalate (PET), polyethylene naphthalate (PEN), or polyimide. A thin film transistor may be located on the substrate 11. In the other embodiment, before forming the TFT, an additional layer such as a buffer layer 12 may be formed on the substrate 11. The buffer layer 12 may be formed on the entire surface of the substrate 11 or may be formed by patterning.

The buffer layer 12 may have a suitable material including PET, PEN, polyacrylate, or polyimide etc., and a layered structure is formed as a single layer or a multilayer lamination. The buffer layer 12 may also be formed of silicon oxide or silicon nitride, or may include a composite layer of an organic material and/or an inorganic material.

The TFT may control the emission of each sub-pixel, or may control the amount of emission when each sub-pixel emits light. The TFT may include a semiconductor layer 21, a gate electrode 22, a source electrode 23, and a drain electrode 24.

The semiconductor layer 21 may be formed of an amorphous silicon layer, a silicon oxide layer, a metal oxide, or a polysilicon layer, or may be formed of an organic semiconductor material. In the other embodiment, the semiconductor layer 21 includes a channel region and source and drain regions doped with dopants.

The semiconductor layer 21 may be covered with a gate insulating layer 25. The gate electrode 22 may be located on the gate insulating layer 25. In general, the gate insulating layer 25 may cover the entire surface of the substrate 11. In the other embodiment, the gate insulating layer 25 may be formed by patterning. In consideration of adhesion with an adjacent layer, formability and surface flatness of a laminated target layer, the gate insulating layer 25 may be formed of silicon oxide, silicon nitride, or other insulating organic or inorganic material. The gate electrode 22 may be covered by an interlayer insulating layer 26 formed of silicon oxide, silicon nitride, and/or other suitable insulating organic or inorganic material. A portion of the gate insulating layer 25 and the interlayer insulating layer 26 may be removed, and a contact hole is formed after the removal to expose a predetermined region of the semiconductor layer 21. The source electrode 23 and the drain electrode 24 may contact the semiconductor layer 21 via a contact hole. The source electrode 23 and the drain electrode 24 may be composed of aluminum (Al), platinum (Pt), palladium (Pd), silver (Ag), magnesium (Mg), gold (Au), nickel (Ni), neodymium (Nd), iridium (Ir), A single material layer or composite material layer of at least one selected from the group consisting of chromium (Cr), lithium (Li), calcium (Ca), molybdenum (Mo), titanium (Ti), tungsten (W), and copper (Cu) or other suitable alloys.

A protective layer 27 formed of silicon oxide, silicon nitride, and/or other suitable insulating organic or inorganic material may cover the TFT. The protective layer 27 covers all or a partial portion of the substrate 11. As a TFT having a complicated layer structure is located below the protective layer 27, the top surface of the protective layer 27 may not be sufficiently flat. It is therefore necessary to form a planarization layer 28 on the protective layer 27 so as to form a sufficiently flat top surface.

After the planarization layer 28 is formed, a through hole may be formed in the protective layer 27 and the planarization layer 28 to expose the source electrode 23 and the drain electrode 24 of the TFT.

Then, the first color sub-pixel electrode 31, the second color sub-pixel electrode 32, and the third color sub-pixel electrode 33 are formed on the planarization layer 28. The first color sub-pixel electrode 31 is formed in the first pixel region. The second color sub-pixel electrode 32 is formed in the second color sub-pixel region. The third color sub-pixel electrode 33 is formed in the third color sub-pixel region. The first color sub-pixel electrode 31, the second color sub-pixel electrode 32, and the third color sub-pixel electrode 33 may be simultaneously or synchronously formed. Each of the first color sub-pixel electrode 31, the second color sub-pixel electrode 32, and the third color sub-pixel electrode 33 may be electrically connected to the TFT through the through-hole. The first color sub-pixel electrode 31, the second color sub-pixel electrode 32, and the third color sub-pixel electrode 33 are generally referred to as anodes.

Each of the first color sub-pixel electrode 31, the second color sub-pixel electrode 32, and the third color sub-pixel electrode 33 may form a transparent electrode (transflective type) or a reflective electrode. When the first color sub-pixel electrode 31, the second color sub-pixel electrode 32, and the third color sub-pixel electrode 33 form a transparent electrode (transflective type) electrode, they can be formed of indium tin oxide (ITO), indium zinc oxide (IZO), Zinc oxide (ZnO), indium oxide ($In_2O_3$), indium gallium oxide (IGO), or aluminum zinc oxide (AZO).

When the first color sub-pixel electrode 31, the second color sub-pixel electrode 32, and the third color sub-pixel electrode 33 form a reflective electrode, silver (Ag), magnesium (Mg), aluminum (Al), platinum (Pt), palladium (Pd), A reflective layer formed of gold (Au), nickel (Ni), neodymium (Nd), iridium (Ir), chromium (Cr), or a mixture of any of these materials form the reflective layer, and a transparent electrode material such as indium tin oxide (ITO), indium zinc oxide (IZO), zinc oxide (ZnO), and indium oxide ($In_2O_3$) forms an auxiliary layer, which are superimposed to form the reflective electrode layer. The structures and materials of the first color sub-pixel electrode 31, the second color sub-pixel electrode 32, and the third color sub-pixel electrode 33 are not limited thereto and are variable.

After forming the first color sub-pixel electrode 31, the second color sub-pixel electrode 32, and the third color sub-pixel electrode 33, as shown in FIG. 30, a pixel-defining layer (PDL) 41 may be formed. The formed PDL covers the first color sub-pixel electrode 31, the second color sub-pixel electrode 32, and the third color sub-pixel electrode 33. The PDL may be used to define a sub-pixel by having an opening corresponding to each sub-pixel, i.e., an opening exposing a central portion of each sub-pixel. The PDL may be formed of a single material layer or composite material layer including a suitable organic material such as polyacrylate and polyimide or a suitable inorganic material.

The PDL may be formed in such a manner that a layer for PDL is formed on the entire surface of the substrate 11 by using a material suitable for PDL to cover the first color sub-pixel electrode 31, a second color sub-pixel electrode 32 and a third color sub-pixel electrode 33. Then, the PDL layer will be patterned to expose the central portions of the first color sub-pixel electrode 31, the second color sub-pixel electrode 32, and the third color sub-pixel electrode 33.

The light-emitting layer 51 may be formed by vapor-deposition of a light-emitting material. The vapor-deposition material covers a portion of the first color sub-pixel electrode 31 that is not covered by the PDL layer, a portion of the second color sub-pixel electrode 32 that is not covered by the PDL layer, a portion of the third color sub-pixel electrode 33 that is not covered by the PDL layer, and a top surface of the PDL layer.

A precise metal mask can be used to vapor-deposit light-emitting materials that emit red, green, and blue light.

Then, a counter electrode 61 covering the first color sub-pixel region, the second color sub-pixel region, and the third color sub-pixel region is formed by vapor-deposition. The counter electrode 61 may be integrally formed with respect to a plurality of sub-pixels so as to cover the entire display area. The counter electrode 61 is commonly referred to as a cathode.

The counter electrode 61 contacts the electrode power supply line outside the display area so that the electrode power supply line can receive an electric signal. The counter electrode 61 may form a transparent electrode or a reflective electrode. When the counter electrode 61 forms a transparent electrode, the counter electrode 61 may include a layer formed by depositing Li, Ca, LiF/Ca, LiF/Al, Al, Mg or a mixed material of any of these materials in a direction toward the light-emitting layer, and an auxiliary electrode or bus electrode wire formed of a transparent (transflective) material including ITO, IZO, ZnO, or $In_2O_3$. When the counter electrode 61 is formed as a reflective electrode, the counter electrode 61 may have a layer including one or more materials selected from Li, Ca, LiF/Ca, LiF/Al, Al, Ag, and Mg. However, the configuration and material of the counter electrode 61 are not limited thereto and are variable.

Figure 31:
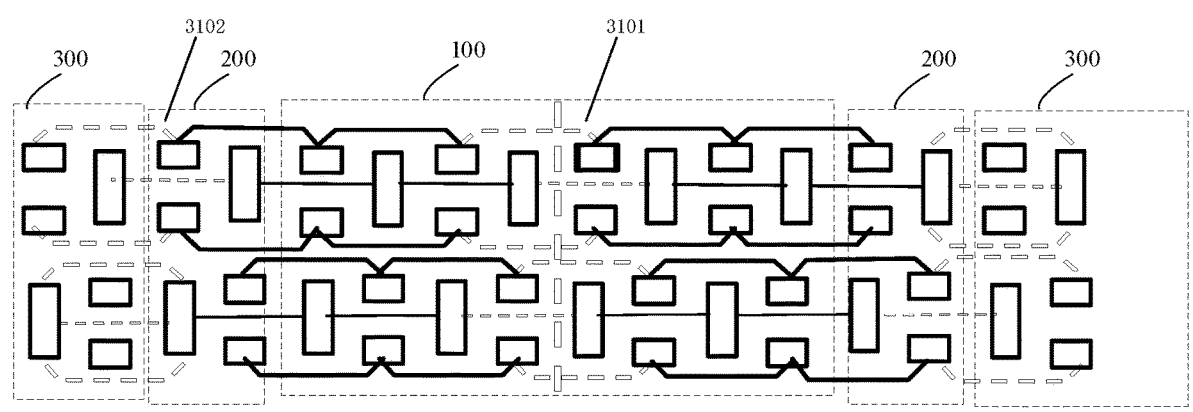
FIG. 31 is a schematic view of a structure of a sub-pixel driving of a display screen according to the other embodiment.

The present disclosure provides a display screen including a first region 3101 and a second region 3102, as shown in FIG. 31. The first-type light-emitting unit 100 is provided in the first region 3101, and the second-type light-emitting unit 200 is provided in the second region 3102, and the first-type light-emitting unit 100 is different from the second-type light-emitting unit 200.

Specifically, the drive array for the first-type light-emitting unit 100 is not in the first region 3101, and the drive array for the second-type light-emitting unit 200 is in the second region 3102. That is, the drive array for the second-type light-emitting unit 200 is normally located in the second region 3102, and the drive array for the first-type light-emitting unit 100 is not provided in the first region 3101, and is rather located in the second region 3102 different from the first region 3101. Thus, the drive array for the first-type light-emitting unit 100 is not provided in the first region 3101. It can be seen from the layered structure of the organic light-emitting display device shown in FIG. 30 that, the gate electrode 22, the source electrode 23, and the drain electrode 24 in the TFT drive array may form a metal mesh. As light incidents from outside the display screen, the metal mesh causes diffraction or interference of the light, commonly referred to as a grating effect. Thus, when the under-screen photosensitive module is located under the display screen or embedded in the display screen, the working of the under-screen photosensitive module is affected. However, in the embodiment of the present disclosure, the drive array for the first-type light-emitting unit 100 is not in the first region, so that interference and diffraction of light by the drive array can be reduced, and thus the imaging effect can be improved.

Furthermore, in the other embodiment provided of the present disclosure, there are a plurality of pixel groups in the first-type light-emitting unit 100, each pixel group having a plurality of first-type sub-pixels, and a plurality of first-type sub-pixels in each pixel group are driven in series.

Furthermore, in yet another embodiment provided of the present disclosure, one of the plurality of pixel groups is one selected from the group consisting of a red pixel array, a green pixel array, and a blue pixel array.

The first color sub-pixel, the second color sub-pixel, and the third color sub-pixel may emit color light of different colors, for example, red (R), green (G), and blue (B). The color of the light emitted by the three sub-pixels is different from each other. The first color sub-pixel, the second color sub-pixel, and the third color sub-pixel here may also be sub-pixels of other color light, or may be a sub-pixel combination in which sub-pixels of different color light are superimposed. To maintain white balance and reduce production costs, the first color sub-pixel, the second color sub-pixel, and the third color sub-pixel may be a red sub-pixel, a green sub-pixel, and a blue sub-pixel, respectively.

One pixel group may be one selected from the group consisting of a red pixel array, a green pixel array, and a blue pixel array. The plurality of pixel groups may be formed by mixing a red pixel array, a green pixel array, and a blue pixel array to achieve white balance.

Furthermore, in the other embodiment provided of the present disclosure, the first-type light-emitting unit 100 is driven by a drive array of the second-type light-emitting unit 200.

Referring to FIG. 31, the drive array of the first-type light-emitting unit 100 is driven by the drive array of the second-type light-emitting unit 200 located on the left and right sides. Pixel groups in the first-type light-emitting unit 100 emit or do not emit light in the same time. In a particular application, the pixel group may be configured to indicate the capacity of a battery, a strength of a network signal, etc.

Furthermore, in the other embodiment provided of the present disclosure, for each pixel group in the first-type light-emitting unit 100, the second-type light-emitting unit 200 has a plurality of second-type sub-pixels, there are driving sub-pixels corresponding to each pixel group and connected in series among the plurality of second-type sub-pixels.

Furthermore, in the other embodiment provided of the present disclosure, the color of the driving sub-pixel is the same as the color of the pixel group in the first typed light emitting unit 100 driven in series therewith.

Referring again to FIG. 31, one pixel group of the first-type light-emitting unit 100 corresponds to one driving sub-pixel of the second-type light-emitting unit 200. Specifically, for example, the red pixel array of the first-type light-emitting unit 100 corresponds to one red sub-pixel on the left side of the red pixel array of the first typed light emitting unit 100, or corresponds to one red sub-pixel on the right side of the red pixel array of the first typed light emitting unit 100. The red pixel array and the red sub-pixel may correspond to each other in the same row or in the same column, or may correspond to a certain number of rows or columns at intervals. The color light emitted by one pixel group may be the same as the color light emitted by the driving sub-pixel to facilitate control.

Furthermore, in the other embodiment provided by the present disclosure, any one of the plurality of pixel groups extends from a first side to an second side of the first region opposite to the first side, and two sub-pixels at both ends of the pixel group are respectively connected in series with two driving sub-pixels in the second-type light-emitting unit 200.

Referring again to FIG. 31, one pixel group of the first-type light-emitting unit 100 corresponds to the driving sub-pixels of the (two) second-type light-emitting units 200. The driving sub-pixels of the (two) second-type light-emitting unit 200 may be located on both sides of the pixel group, respectively. That is, any one pixel group in the pixel group extends from the first side to the second side of the first region opposite to the first side, and two sub-pixels at both ends thereof are respectively connected in series with two driving sub-pixels in the second-type light-emitting unit 200. Thus, the intensity of the driving signal of one pixel group can be equally assumed by the sub-pixels on both sides, and the intensity requirement of the driving signal can be reduced.

Furthermore, in the other embodiment provided by the present disclosure, a plurality of second-type sub-pixels in the second-type light-emitting unit 200 are independently driven.

The second-type light-emitting unit 200 may include a plurality of second-type sub-pixels. The second-type sub-pixels are driven independently. Specifically, for example, the second-type light-emitting unit 200 includes a red sub-pixel, a green sub-pixel, and a blue sub-pixel. An active matrix organic light-emitting diode (AMOLED) is a display technology in which organic light-emitting diode (OLED) pixels are deposited or integrated on a TFT array, the amount of current flowing into each OLED pixel is controlled by the TFT array, thereby determining the luminous intensity of each pixel point. In the embodiments provided of the present disclosure, the display screen may be prepared using AMO- LED technology. Reference can be made to the method of the organic light-emitting display device described above for a specific method of manufacture. The red sub-pixels are independently driven by one cell in the corresponding TFT array.

Furthermore, in the other embodiment of the present disclosure, the display screen is provided with a compensation circuit 300.

In the other embodiment, the compensation circuit 300 is electrically connected to the first-type light-emitting unit 100. In another embodiment, the compensation circuit 300 is electrically connected to the second-type light-emitting unit 200. In other embodiments, the compensation circuit 300 may be further electrically connected to the first-type light-emitting unit 100 and the second-type light-emitting unit 200. The compensation circuit 300 is configured to balance a brightness difference between the first-type light-emitting unit 100 and the second-type light-emitting unit 200.

The compensation circuit 300 may be located on both sides of any pixel group of the first-type light-emitting unit 100, and the compensation circuit 300 is connected in series with sub-pixels at both ends of any pixel group to input a driving signal to the pixel group so as to enhance the driving signal of the pixel group.

Further, the compensation circuit 300 may be located outside the driving sub-pixel of the second-type light-emitting unit 200 in series with the driving sub-pixel to further enhance the driving signal of the first-type light-emitting unit 100.

As can be seen from the above, one pixel group in the first-type light-emitting unit 100 corresponds to at least one driving sub-pixel in the second-type light-emitting unit 200, it is equivalent to that one driving sub-pixel is driving several sub-pixels simultaneously. The second-type light-emitting unit 200 is independently driven, and is equivalent to driving one sub-pixel at a time. The same driving signal drives the first-type light-emitting unit 100 and the second-type light-emitting unit 200 with different performances. And then the compensation circuit 300 may be provided, so that one sub-pixel of one pixel group in the first-type light-emitting unit 100 and one sub-pixel of the second-type light-emitting unit 200 under the same driving signal have the same performance.

Specifically, the compensation circuit 300 is an extended drive circuit.

The present disclosure is not limited to using the compensation circuit 300 to balance the luminance difference, but may be other approaches, such as balancing the luminance difference using a special UI design of the terminal.

Furthermore, in the other embodiment provided of the present disclosure, there is also provided an electronic device including a display screen and an under-screen photosensitive module, the display screen includes a first region and a second region, the under-screen photosensitive module is capable of sensing incident light through the display screen.

A first-type light-emitting unit 100 is provided in the first region, and a second-type light-emitting unit 200 different from the first-type light-emitting unit 100 is provided in the second region, the drive array for the first-type light-emitting unit 100 is not in the first region, and the drive array for the second-type light-emitting unit 200 is in the second region.

The display screen, the first region, and the second region are described in detail previously and are omitted for brevity.

In one specific application provided of the present disclosure, the under-screen photosensitive module may be a camera or a photoelectric sensor. The photoelectric sensor may be, in particular, an infrared sensor for detecting whether a human face is close to the display screen.

The electronic device of the present disclosure can be understood as a stand-alone product such as a mobile phone, and a tablet computer, etc. The electronic device may also include a DC power source, a DC power source or an AC power interface, a memory, a processor, etc.

The DC power supply here may be a lithium battery in a specific application. The DC power supply or AC power interface may be a micro-USB plug-in interface in a specific application. The memory may be a flash memory chip. And the processor may be a CPU having an arithmetic function, a single-chip computer, etc.

Furthermore, in the other embodiment provided of the present disclosure, the under-screen photosensitive module is at least one of a photoelectric sensor and a camera.

The under-screen photosensitive module may be set as needed. The under-screen photosensitive module may be at least one of a photoelectric sensor and a camera.

Furthermore, in the other embodiment provided of the present disclosure, the under-screen photosensitive module is embedded under the display screen by 4 mm to 6 mm.

In the display screen, as the depth of light propagation gradually increases, the light intensity is attenuated. When the under-screen photosensitive module is embedded to a depth of 4 mm to 6 mm under the display screen, a stable assembly of the under-screen photosensitive module can be ensured. In addition, the light intensity can be ensured to be within the required range.

The foregoing embodiments are merely specific implementations of the present disclosure, and the description thereof is more specific and detailed, and are not intended to limit the protection scope of the present disclosure. It should be noted that any variation or replacement readily figured out by persons skilled in the art without departing from the spirit and scope of the present disclosure shall all fall into the protection scope of the present disclosure. Therefore, the protection scope of the present disclosure shall be determined by the appended claims.

The invention claimed is:

1. A display screen comprising:
   a first display region;
   a first-type light-emitting unit provided in the first display region, the first-type light-emitting unit comprising a pixel region and an electro-variable light transmittance material located on a periphery of the pixel region, the electro-variable light transmittance material being light absorbable during a power on process, and the electro-variable light transmittance material being light transmissive during a power off process; and
   a second display region different from the first display region, wherein a second-type light-emitting unit is located in the second display region, the second-type light-emitting unit includes a pixel region and a pixel-defining layer located on a periphery of the pixel region, and the second-type light-emitting unit does not contain the electro-variable light transmittance material.

2. The display screen according to claim 1, wherein the electro-variable light transmittance material forms a pixel-defining layer of the first-type light-emitting unit.

3. The display screen according to claim 1, wherein a thickness of the electro-variable light transmittance material is less than a thickness of a pixel-defining layer in the pixel region.

4. The display screen according to claim 1, wherein in the first-type light-emitting unit, a transparent pixel-defining layer is provided on the electro-variable light transmittance material.

5. The display screen according to claim 4, wherein a thickness of the electro-variable light transmittance material is about 1 μm to about 3 μm, and a thickness of the pixel-defining layer is about 3 μm to about 5 μm.

6. The display screen according to claim 1, wherein:
a pixel-defining layer is provided on the periphery of the pixel region,
the electro-variable light transmittance material is embedded in the pixel-defining layer,
the display screen comprises a conductive layer located under the first-type light-emitting unit, and
the electro-variable light transmittance material is in contact with the conductive layer.

7. The display screen according to claim 6, wherein the electro-variable light transmittance material is located between the pixel-defining layer and the pixel region.

8. The display screen according to claim 6, wherein the electro-variable light transmittance material is formed as a strip, a ratio of a width of the strip to the width of the pixel-defining layer is between 1:2 and 3:4.

9. The display screen according to claim 8, wherein a width of the strip is about 4 μm to about 10 μm.

10. The display screen according to claim 1, wherein a polarizer is not provided above the first display region in the display screen.

11. The display screen according to claim 1, wherein the electro-variable light transmittance material is one selected from the group consisting of polyaniline, polythiophene, and polythiophene derivative.

12. The display screen according to claim 1, wherein the electro-variable light transmittance material is 1,3-dimethylpolythiophene or 1,4-p-dimethylpolythiophene.

13. The display screen according to claim 1, wherein the electro-variable light transmittance material is one selected from the group consisting of tungsten oxide, titanium oxide, and nickel oxide.

14. The display screen according to claim 1, wherein the electro-variable light transmittance material is arranged closely adjacent to the pixel region of the first-type light-emitting unit.

15. The display screen according to claim 14, wherein the pixel-defining layer of the first-type light-emitting unit is adjacent to a side of the pixel region, and a cross-sectional shape of the pixel region of the first-type light-emitting unit is defined as an inverted trapezoid.

16. The display screen according to claim 14, wherein a thickness of the pixel-defining layer of the first-type light-emitting unit is substantially 4 μm to substantially 8 μm.

17. An electronic device, comprising a display screen and an under-screen photosensitive module capable of sensing light incident through the display screen, wherein the display screen comprising:
a first display region for arranging a front device,
a first-type light-emitting unit being provided in the first display region, the first-type light-emitting unit comprising a pixel region and an electro-variable light transmittance material located on a periphery of the pixel region, and the electro-variable light transmittance material being light absorbable during a powered on process, and being light transmissive during a power off process; and
a second display region different from the first display region, wherein a second-type light-emitting unit is located in the second display region, the second-type light-emitting unit includes a pixel region and a pixel-defining layer located on a periphery of the pixel region, and the second-type light-emitting unit does not contain the electro-variable light transmittance material.

18. The electronic device according to claim 17, wherein the under-screen photosensitive module is a photoelectric sensor or a camera.

* * * * *